(12) United States Patent
Akhavan et al.

(10) Patent No.: US 11,569,832 B1
(45) Date of Patent: Jan. 31, 2023

(54) ANALOG-TO-DIGITAL CONVERSION

(71) Applicant: Qualcomm Incorporated, San Diego, CA (US)

(72) Inventors: Aram Akhavan, San Diego, CA (US); Seyed Arash Mirhaj, Poway, CA (US); Lei Sun, San Diego, CA (US); Elias Dagher, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/385,799

(22) Filed: Jul. 26, 2021

(51) Int. Cl.
*H03M 1/10* (2006.01)
*H04B 1/40* (2015.01)

(52) U.S. Cl.
CPC ............. *H03M 1/1023* (2013.01); *H04B 1/40* (2013.01)

(58) Field of Classification Search
CPC ...... H03M 1/1023; H03M 1/44; H03M 1/442; H04B 1/40
USPC .................................................. 341/120, 161
See application file for complete search history.

(56) References Cited

U.S. PATENT DOCUMENTS

| | | |
|---|---|---|
| 6,346,907 B1 | 2/2002 | Dacy et al. |
| 7,609,756 B2 | 10/2009 | Wood |
| 8,618,967 B2 | 12/2013 | Nikaeen et al. |
| 8,624,768 B2 * | 1/2014 | Tsai .................... H03M 1/1023 341/161 |
| 8,698,062 B2 | 4/2014 | Yoshida |
| 9,483,028 B1 * | 11/2016 | Kinyua ................. H03M 1/124 |

FOREIGN PATENT DOCUMENTS

JP  2017011358 A  1/2017

OTHER PUBLICATIONS

Ding M., et al., "A 5bit 1GS/s 2.7mW 0.05mm2 Asynchronous Digital Slope ADC in 90nm CMOS for IR UWB Radio", 2012 IEEE Radio Frequency Integrated Circuits Symposium, 2012 IEEE, Jun. 17-19, 2012, pp. 487-490.
Harpe P.J.A., et al., "A 0.8-mW 5-bit 250-MS/s Time-Interleaved Asynchronous Digital Slope ADC," IEEE Journal of Solid-State Circuits, Nov. 2011, vol. 46, No. 11, pp. 2450-2457.
Shu Y., et al., "A 5-Bit 500-MS/s Asynchronous Digital Slope ADC With Two Comparators", IEEE Transactions on Circuits and Systems—II: Express Briefs, vol. 65, No. 4, Apr. 2018, pp. 426-430.
Shu Y., et al., "A Single-Channel 5bit 333MS/S Asynchronous Digital Slope ADC Based on CMOS Technology", 2017 3rd International Conference on Computational Intelligence & Communication Technology (CICT), Feb. 9-10, 2017, pp. 1-4.
International Search Report and Written Opinion—PCT/US2022/073958—ISA/EPO—dated Nov. 9, 2022, 13 pages.

(Continued)

*Primary Examiner* — Khai M Nguyen
(74) *Attorney, Agent, or Firm* — Colby Nipper

(57) ABSTRACT

An apparatus is disclosed for analog-to-digital conversion. In an example aspect, the apparatus includes an analog-to-digital converter (ADC). The ADC includes a reference-crossing detector having an input and an output. The ADC also includes a ramp generator coupled between the output of the reference-crossing detector and the input of the reference-crossing detector. The ADC further includes a voltage shifter coupled between the output of the reference-crossing detector and the input of the reference-crossing detector.

67 Claims, 17 Drawing Sheets

(56) References Cited

OTHER PUBLICATIONS

Peng C-C., et al., "A 10.7b 300MS/s Two-Step Digital-Slope ADC in 65nm CMOS", IEEE Transactions on Circuits and Systems I: Regular Papers, [Online], US, vol. 67, No. 9, Sep. 1, 2020, XP055975864, pp. 2948-2959, Section II, Section III, figures 3-11.

* cited by examiner

ANALOG-TO-DIGITAL CONVERSION

TECHNICAL FIELD

This disclosure relates generally to signal communication or signal processing using an electronic device and, more specifically, to analog-to-digital conversion.

BACKGROUND

Electronic devices include traditional computing devices such as desktop computers, notebook computers, smartphones, wearable devices like a smartwatch, and internet servers. However, electronic devices also include other types of computing devices such as personal voice assistants (e.g., smart speakers), wireless access points or routers, thermostats and other sensors or automated controllers, robotics, automotive electronics, devices embedded in other machines like refrigerators and industrial tools, and Internet of Things (IoT) devices. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi network, or a cellular network. Electronic communications can therefore include both wireless and wired transmissions and receptions. To make such electronic communications, an electronic device can use a transceiver, such as a wireless transceiver for wireless communications.

Electronic communications can be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, performing searches, acquiring map information or navigational instructions, finding friends, engaging in location-based services generally, transferring money, and obtaining another service like a car ride.

Many of these mobile services depend at least partly on the transmission and reception of wireless signals between two or more electronic devices. Consequently, scientists, electrical engineers, and other designers of electronic devices strive to develop wireless transceivers that can use wireless signals effectively to provide these and other mobile services.

SUMMARY

To facilitate transmission and reception of wireless signals, an electronic device can use a wireless interface device that includes a wireless transceiver. The wireless transceiver, along with other components of an electronic device, can include an analog-to-digital converter (ADC). A type of ADC, an asynchronous digital ramp ADC, may have characteristics that cause slower ADC operation and/or that produce troublesome residue amounts in pipeline ADCs. In example implementations, an asynchronous digital ramp ADC can include a reference-crossing detector, a ramp generator, and a voltage shifter or an offset adjuster. The voltage shifter can shift a voltage of an input signal by a voltage shift amount that is based on a value of the input signal to reduce how far a ramp climbs before a digital value is locked. By reducing the ramping range, the digital ramp ADC can operate more quickly. The offset adjuster can adjust an output voltage by a voltage offset amount to reduce a magnitude of a voltage "overshoot" from the ramping process. By reducing the overshoot magnitude, a residue signal in a pipelined ADC application can be scaled more fully to increase an accuracy of a succeeding analog-to-digital conversion stage. An ADC, including an analog-to-digital conversion stage of a pipelined ADC, can include a voltage shifter and an offset adjuster.

In an example aspect, an apparatus for analog-to-digital conversion is disclosed. The apparatus includes an analog-to-digital converter (ADC). The ADC includes a reference-crossing detector, a ramp generator, and a voltage shifter. The reference-crossing detector includes an input and an output. The ramp generator is coupled between the output of the reference-crossing detector and the input of the reference-crossing detector. The voltage shifter is also coupled between the output of the reference-crossing detector and the input of the reference-crossing detector.

In an example aspect, an apparatus for analog-to-digital conversion is disclosed. The apparatus includes means for producing a first signal responsive to a second signal and based on a reference value. The apparatus also includes means for shifting a voltage based on the first signal at a first time, with the voltage corresponding to the second signal. The apparatus further includes means for ramping the voltage responsive to a digital value that is based at least partially on the first signal at a second time, with the digital value corresponding to at least a portion of a digital output signal.

In an example aspect, a method for analog-to-digital conversion is disclosed. The method includes producing a first signal based on a second signal and a reference value. The method also includes shifting a voltage of the second signal based on the first signal. The method additionally includes ramping the voltage of the second signal responsive to a digital value. The method further includes latching the digital value based on a change of the first signal.

In an example aspect, an apparatus for analog-to-digital conversion is disclosed. The apparatus includes a pipelined analog-to-digital converter. The pipelined analog-to-digital converter includes multiple analog-to-digital conversion stages and at least one amplifier coupled between two or more analog-to-digital conversion stages of the multiple analog-to-digital conversion stages. At least one analog-to-digital conversion stage of the multiple analog-to-digital conversion stages includes a reference-crossing detector, a ramp generator, and at least one capacitor. The reference-crossing detector includes an input and an output. The ramp generator is coupled to the output of the reference-crossing detector. The ramp generator includes multiple buffers coupled together in series and multiple capacitors. The multiple capacitors are coupled between the multiple buffers and the input of the reference-crossing detector. The at least one capacitor is coupled between the output of the reference-crossing detector and the input of the reference-crossing detector.

In an example aspect, an apparatus for analog-to-digital conversion is disclosed. The apparatus includes an analog-to-digital converter (ADC). The ADC includes a reference-crossing detector, a ramp generator, and an offset adjuster. The reference-crossing detector includes an input and an output. The ramp generator is coupled between the output of the reference-crossing detector and the input of the reference-crossing detector. The offset adjuster is also coupled between the output of the reference-crossing detector and the input of the reference-crossing detector.

BRIEF DESCRIPTION OF DRAWINGS

FIG. 4-1 is a schematic diagram of an example ADC including a reference-crossing detector, a ramp generator, and a voltage shifter.

FIG. 4-2 is a schematic diagram of an example ADC including a reference-crossing detector, a ramp generator, and an offset adjustor.

FIG. 12-1 is a flow chart illustrating an example calibration process for a first phase for determining an offset voltage adjustment amount.

FIG. 12-2 is a flow chart illustrating an example calibration process for a second phase for determining an offset voltage adjustment amount.

DETAILED DESCRIPTION

Figure 1:
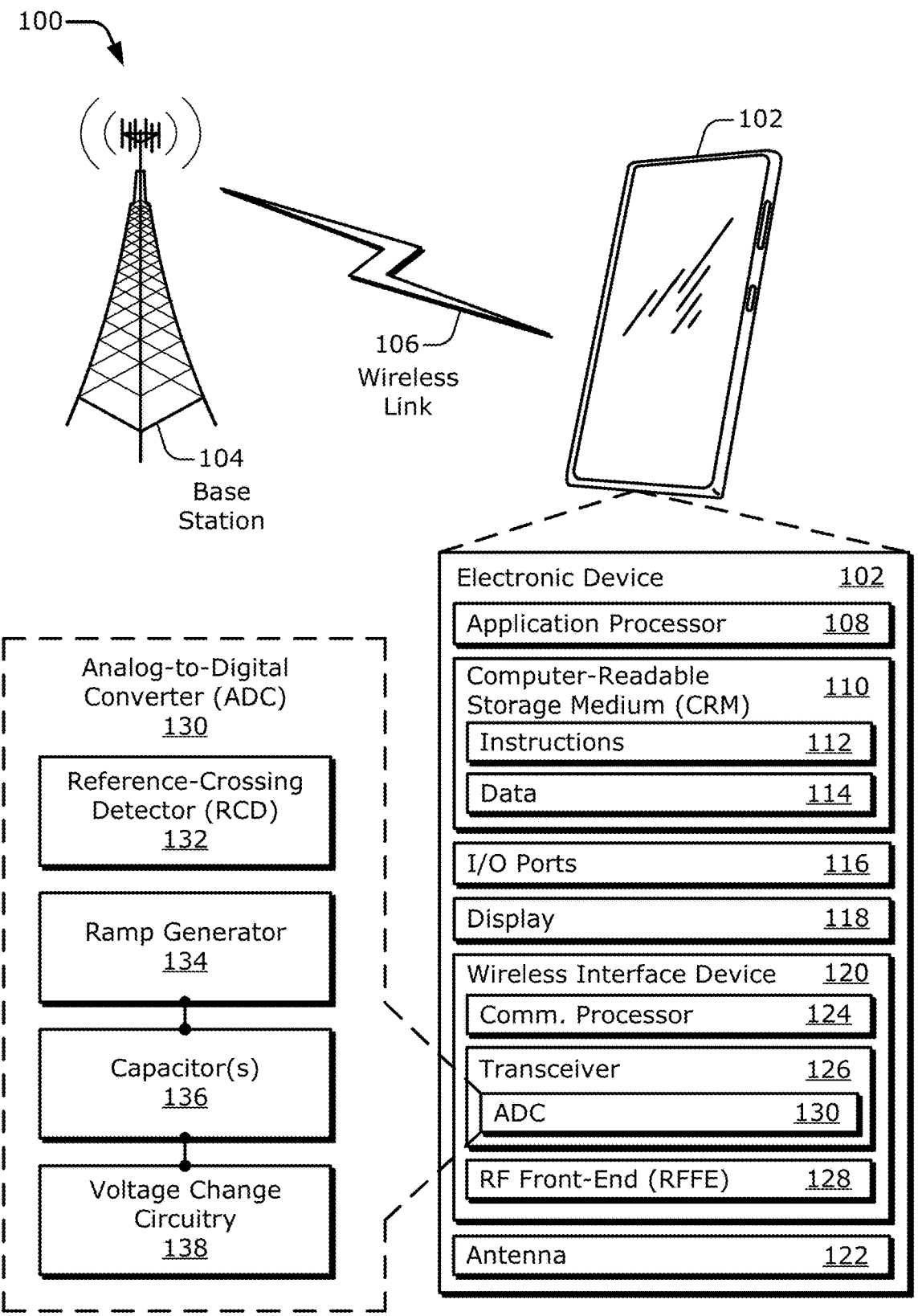
FIG. 1 illustrates an environment with an example electronic device including a wireless interface device, which includes a transceiver having an analog-to-digital converter (ADC).

To facilitate transmission and reception of wireless signals, an electronic device can use a wireless interface device that includes a wireless transceiver. The wireless transceiver includes several components to generate, manipulate, condition, or otherwise process signals for transmission or reception. For example, an analog-to-digital converter (ADC) can be used to convert an analog received signal into a digital signal that can be processed to recover information carried on the received signal. An asynchronous digital ramp ADC is a type of ADC that can be architected to be faster and to use less power than some other types of ADCs. An asynchronous digital ramp ADC can also be designed to be accurate. It can be deployed, in some circumstances, as part of an analog-to-digital conversion stage (ADC stage) of a pipeline ADC.

A pipelined analog-to-digital converter (or a pipeline analog-to-digital converter) has multiple ADC stages. Each ADC stage can be constructed using any of various ADC architectures. For example, an ADC stage (e.g., with 1-2 bits) can be built using a multiplying digital-to-analog converter (DAC) (MDAC). Although an MDAC can be relatively fast, MDACs typically demand complex calibrations and consume significant amounts of power. An ADC stage (e.g., with 3-5 bits) can instead be built using a flash or direct-conversion ADC. Although flash ADCs can also operate quickly, a typical flash ADC occupies a significant area and consumes significant power. A third example architecture for an ADC stage (e.g., with 5-7 bits) is a successive-approximation-register (SAR) ADC. A SAR ADC can usually be constructed to be power efficient, but that same SAR ADC is then slow due to multiple comparators and DAC settling phases.

An asynchronous digital ramp ADC is a fourth type of ADC architecture that can be employed in a pipeline ADC stage. The asynchronous digital ramp ADC can offer multiple bits (e.g., 4-6 bits or another quantity of bits) per ADC stage. The asynchronous digital ramp ADC can be fast, accurate, and calibrated relatively easily for use in an ADC stage. An asynchronous digital ramp ADC, however, can present several problems, which are discussed below.

An asynchronous digital ramp ADC can include a reference-crossing detector (e.g., a zero-crossing detector (ZCD)) and a ramp generator. In example operations, the ramp generator digitally ramps a voltage signal at an input of the reference-crossing detector until that signal crosses a reference value (e.g., a zero-voltage reference value). Responsive to the reference-crossing detector detecting such a signal crossing, the ramp generator can lock a digital value that produces the ramping voltage signal. Thus, the voltage signal corresponds to the digital value of the ramp generator, and the ramp generator can provide the digital value as at least part of a digital output signal for an ADC. If the asynchronous digital ramp ADC is part of a pipeline ADC, the digitally produced voltage signal, which results from the ramping process, can be provided to a next or succeeding ADC stage of the pipeline ADC, including via a residue amplifier.

Some approaches to an asynchronous digital ramp ADC can present problems. First, the ramping period for ramping the voltage signal can be longer than is acceptable for certain applications. For instance, an initial voltage level of a signal that is to be ramped may be too far from the reference value of the reference-crossing detector. Consequently, the ramping time to reach the reference value can cause an appreciable delay before a digital value can be locked, and this delay slows the ADC process. For a pipeline ADC, this delay can be particularly impactful in a first ADC stage. As a second problem, the ramping voltage signal can "overshoot" the reference value. The voltage overshoot can result from latency due to signal propagation or circuitry operation. The additional voltage magnitude, such as a positive voltage "bump" above a zero-volt level, can correspond to an error in the digital value and/or reduce a usable signal range for a succeeding stage of a pipeline ADC.

To address the first problem, in some implementations, a described ADC includes a reference-crossing detector, a ramp generator, and a voltage shifter. The voltage shifter is coupled between an output of the reference-crossing detector and an input of the reference-crossing detector. The voltage shifter can shift a voltage level of an input signal based on a value of a detection signal produced by the reference-crossing detector. Thus, the voltage shifter can shift the voltage at the input of the reference-crossing detector by a voltage amount that depends, at least partly, on a voltage of the input signal. For example, with a zero-voltage reference value and a positive ramping process, the voltage shifter can shift the voltage at the input of the reference-crossing detector by a larger amount if the input signal voltage is positive and by a relatively smaller amount if the input signal voltage is "already" negative.

The ramp generator then begins to ramp the voltage starting from the shifted voltage level, which ramping increases the voltage level in this positive ramping example. By shifting the negative input signal voltage by a relatively smaller voltage amount, the negative input signal starts ramping from a voltage level that is closer to the zero-voltage reference value than it would if the voltage-shifting amount were constant or were not tailored to the input signal voltage. Consequently, the ramping process can conclude faster, and the digital value for the ADC can be determined more quickly. This means the ADC can produce in less time a digital output signal that is representative of an analog input signal.

To address the second problem, in some implementations, a described ADC includes a reference-crossing detector, a ramp generator, and an offset adjuster. The offset adjuster is coupled between an output of the reference-crossing detector and an input of the reference-crossing detector. After a voltage at the input of the reference-crossing detector crosses the reference value, the reference-crossing detector produces a detection signal that can lock a digital value of the ramp generator. Due to latencies in signal propagation or circuitry operation, the ramping signal can exceed, or "overshoot," the targeted reference value. The offset adjuster can reduce a size of the "voltage overshoot" to at least ameliorate the effects of latency. For instance, the offset adjuster can lower an absolute value of the voltage at the input of the reference-crossing detector for a zero-volt reference value.

In example operations, an offset voltage amount or level can be determined as part of a calibration process, which process may analyze an output of a succeeding stage of a pipeline ADC. Responsive to a timing of the detection signal provided at the output of the reference-crossing detector, the offset adjuster can apply the offset voltage amount to reduce the voltage overshoot. With a zero-volt reference value, the offset adjuster may reduce a magnitude of the voltage at the input of the reference-crossing detector. In a pipeline ADC application, the offset adjuster can move the voltage closer to zero volts in preparation for amplification as a residue signal in the pipeline ADC. This decrease of the residue voltage magnitude can at least reduce the overshoot error and can enable a greater scaling of the residue signal. The greater amplification scalability can increase the accuracy of the signal processing by a succeeding ADC stage of a pipeline ADC.

These voltage-shifting and offset-adjusting implementations may also be used together as part of a "standalone" ADC or as part of an analog-to-digital conversion stage (ADC stage) of a pipeline ADC. Thus, a voltage shifter can decrease a ramping period to increase operational speed of the ADC. Further, an offset adjuster can substantially remove an overshoot voltage amount for a residual signal that is to be processed by a succeeding ADC stage to increase accuracy in a pipeline ADC. This document describes some ADC implementations in the context of a wireless interface device, such as a wireless transceiver, and/or a receive chain thereof. Described ADC implementations may, however, be deployed in different environments or employed in alternative applications. For example, an asynchronous digital ramp ADC can be used in a wired communication component, a processor, a system-on-chip (SoC), or an integrated circuit (IC) generally.

FIG. 1 illustrates an example environment 100 with an electronic device 102 having a wireless interface device 120, which includes a transceiver 126 having an analog-to-digital converter 130 (ADC 130). This document describes example implementations of the ADC 130, which can include asynchronous digital ramp ADCs. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), and medical device.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, or another electronic device as described above generally. Hence, the wireless link 106 extends between the electronic device 102 and the base station 104.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX®); and a Bluetooth® standard. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110

(CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, and magnetic media (e.g., disk or tape). In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and cameras or other sensor ports. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similar to or differently from the wireless link 106. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 can include at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or another processor can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately depicted) to store data and processor-executable instructions (e.g., code), such as a CRM 110.

As shown, the transceiver 126 can include at least the ADC 130, which is described below. The transceiver 126 can also include circuitry and logic for filtering, switching, amplification, channelization, or frequency translation. Frequency translation functionality may include an up-conversion or a down-conversion of frequency that is performed through a single conversion operation (e.g., with a direct-conversion architecture) or through multiple conversion operations (e.g., with a superheterodyne architecture). Generally, the transceiver 126 can include filters, switches, amplifiers, or mixers for routing and conditioning signals that are transmitted or received via the antenna 122.

In addition to the ADC 130, the transceiver 126 can include a digital-to-analog converter (DAC). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figure 2:
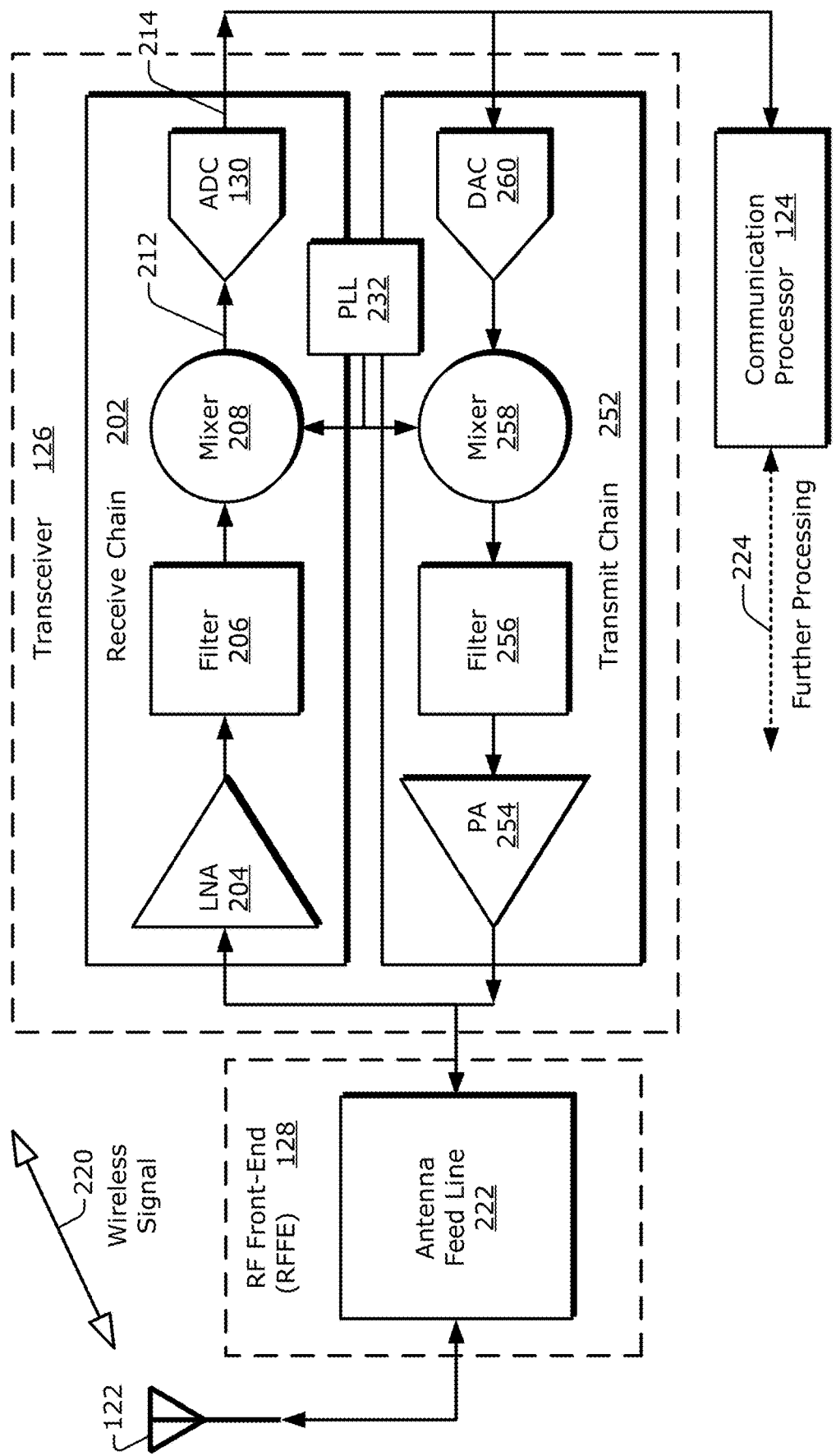
FIG. 2 illustrates an example transceiver including an ADC that is part of a receive chain.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters, switches, or amplifiers for conditioning signals received via the antenna 122 or for conditioning signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, the analog-to-digital converter 130 (ADC 130) is depicted as being part of a transceiver 126. Described implementations of an ADC 130 can, however, additionally or alternatively be employed in other portions of the wireless interface device 120 (e.g., as part of the communication processor 124 or the RF front-end 128) or in other portions of the electronic device 102 generally (e.g., where an analog signal or analog sensor information is digitized for storage or processing).

As illustrated, the ADC 130 can include at least one reference-crossing detector 132 (RCD 132), at least one ramp generator 134, one or more capacitors 136, and voltage change circuitry 138. In some cases, the one or more capacitors 136 can be shared between or distributed across the ramp generator 134 and the voltage change circuitry 138. The voltage change circuitry 138 can include a voltage shifter or an offset adjuster—which phrase can entail including a voltage shifter and an offset adjuster in accordance with an optional but permitted inclusive-or interpretation of the word "or." Example implementations for such ADCs are described below with reference to FIG. 4. An example pipeline ADC 130-1 that may include an analog-to-digital conversion stage having an ADC 130 is described below with reference to FIG. 3. Next, however, this document describes example transceiver implementations.

FIG. 2 illustrates, at 200 generally, an example transceiver 126 including an ADC 130 that is part of a receive chain 202. In addition to the transceiver 126, FIG. 2 depicts the antenna 122, the RF front-end 128, and the communication processor 124. The communication processor 124 communicates one or more data signals to other components, such as the application processor 108 of FIG. 1, for further processing at 224 (e.g., for processing at an application level).

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 may include other non-illustrated components, more or fewer components, and differently coupled arrangements of components.

In some implementations, the RF front-end 128 couples the antenna 122 to the transceiver 126 via the antenna feed line 222. In operation, the antenna feed line 222 propagates a signal between the antenna 122 and the transceiver 126. During or as part of the signal propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, or a phase shifter.

In some implementations, the transceiver 126 can include at least one receive chain 202, at least one transmit chain 252, or at least one receive chain 202 and at least one transmit chain 252. The receive chain 202 can include a low-noise amplifier 204 (LNA 204), a filter 206, a mixer 208 for frequency down-conversion, and an ADC 130. The transmit chain 252 can include a power amplifier 254 (PA 254), a filter 256, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically disposed anywhere along the depicted receive and transmit chains.

The receive chain 202 is coupled between the antenna feed line 222 of the RF front-end 128 and the communication processor 124—e.g., via the low-noise amplifier 204 and the ADC 130, respectively. The transmit chain 252 is coupled between the antenna feed line 222 and the communication processor 124—e.g., via the power amplifier 254 and the DAC 260, respectively. The transceiver 126 can also include at least one phase-locked loop 232 (PLL 232) that is coupled to a mixer 208 or 258. For example, the transceiver 126 can include one PLL 232 for each transmit/receive chain pair, one PLL 232 per transmit chain and one PLL 232 per receive chain, or multiple PLLs 232 per chain.

As shown for certain example implementations of the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the ADC 130. The ADC 130 is in turn coupled to the communication processor 124. As shown for certain example implementations of the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components. Although the ADC 130 and the DAC 260 are illustrated as being separately coupled to the processor 124, they may share a bus or other means for communicating with the processor 124.

As part of an example signal-receiving operation, the low-noise amplifier 204 provides an amplified signal to the filter 206. The filter 206 filters the amplified signal and provides a filtered signal to the mixer 208. The mixer 208 performs a frequency conversion operation on the filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the ADC 130 for conversion and forwarding to the communication processor 124.

Generally, the ADC 130 accepts or otherwise receives an analog input signal 212 from another component, such as the mixer 208. The ADC 130 performs an analog-to-digital conversion operation on the analog signal to produce a digital signal. To do so, the ADC 130 can quantize a sampled portion of the analog signal into a bin of multiple bins. The ADC 130 can further assign a digital value corresponding to the bin to represent the sampled instance of the signal. Thus, the ADC 130 can produce a digital output signal 214, which may span one or more sampled instances of the analog input signal 212. The ADC 130 can provide or forward the digital output signal 214 to another component, such as the communication processor 124.

As described with reference to FIG. 3, the ADC 130 may be implemented as at least one pipeline ADC, using at least one pipeline ADC, or as a portion of a pipeline ADC. Although the ADC 130 is shown as part of a receive chain 202 of a transceiver 126, an ADC 130 (including a pipeline ADC 130) may be implemented in other components or portions of an electronic device.

Figure 3:
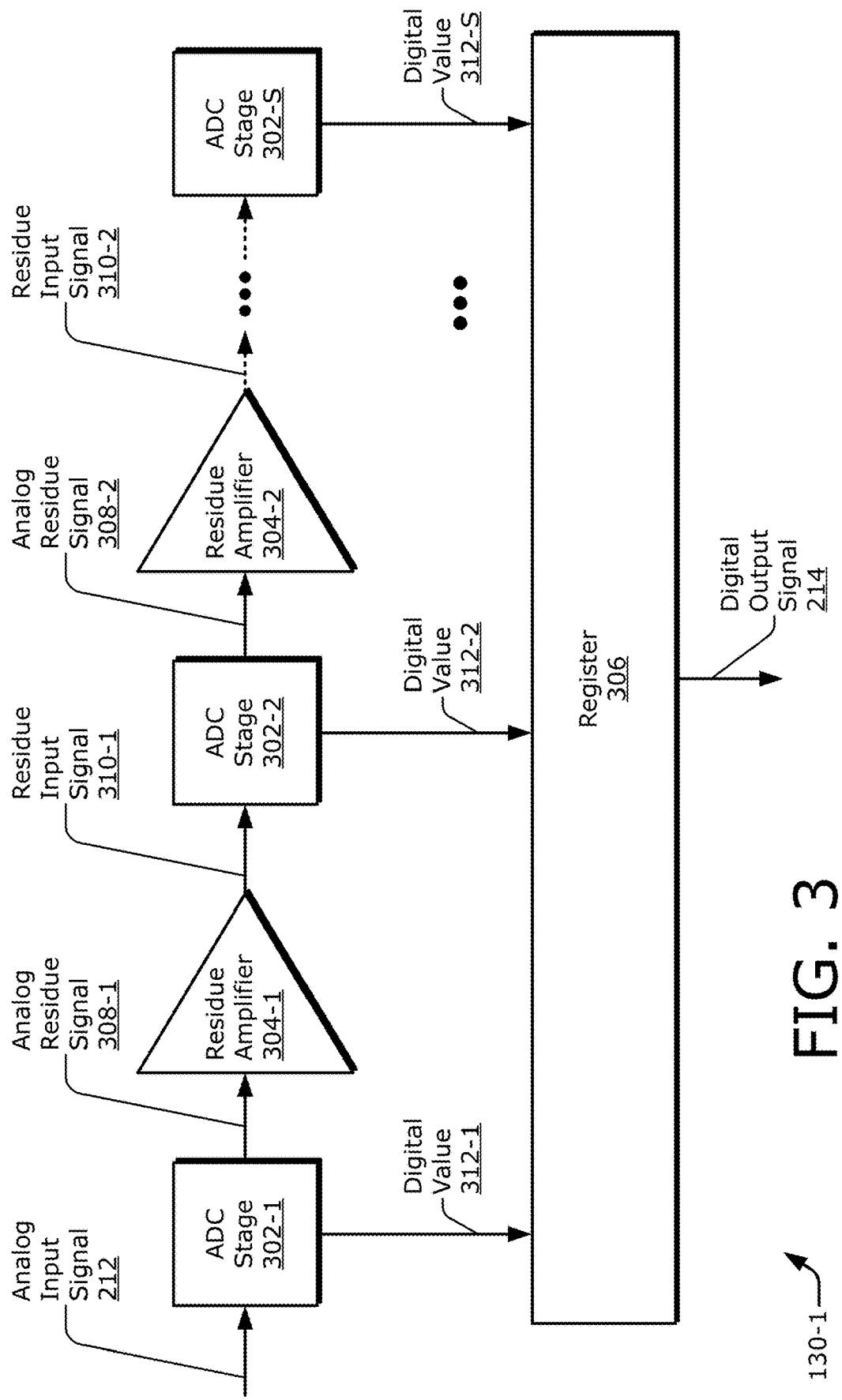
FIG. 3 illustrates an example pipelined ADC including multiple analog-to-digital conversion stages (ADC stages) and at least one amplifier.

FIG. 3 illustrate an example pipeline ADC 130-1 including multiple analog-to-digital conversion stages (ADC stages) and at least one amplifier, such as a residue amplifier 304. The pipeline ADC 130-1 (or pipelined ADC 130-1) accepts an analog input signal 212 and produces a digital output signal 214. To do so, the pipeline ADC 130-1 uses two or more ADC stages that can operate substantially in parallel but on different parts of the analog input signal 212 at different times to generate digital values that form the digital output signal 214.

In example implementations, the pipeline ADC 130-1 includes multiple ADC stages 302-1, 302-2, . . . , 302-S, with "S" representing an integer that is greater than one. The pipeline ADC 130-1 also includes multiple residue amplifiers 304-1, 304-2, . . . , 304-(S−1) (with the "(S−1)th" amplifier not explicitly shown). In some cases, a quantity of residue amplifiers may be one less than a quantity of ADC stages. Generally, at least one residue amplifier 304 is coupled to, and interlaced between, two or more of the multiple ADC stages 302-1 to 302-S. For example, a first residue amplifier 304-1 is coupled between an output of a first ADC stage 302-1 and an input of a second ADC stage 302-2. Similarly, a second residue amplifier 304-2 is coupled between an output of the second ADC stage 302-2 and an input of a third ADC stage 302-3 (not explicitly shown). The pipeline ADC 130-1 also includes at least one register 306 that can be coupled to multiple ADC stages, such as to each ADC stage 302 of the multiple ADC stages 302-1 to 302-S.

In example operations, a respective ADC stage 302 of the multiple ADC stages 302-1 to 302-S produces a respective digital value 312 of multiple digital values 312-1 to 312-S. For example, the first ADC stage 302-1 can produce a first digital value 312-1, and the second ADC stage 302-2 can produce a second digital value 312-2. The "Sth" ADC stage 302-S can produce an "Sth" digital value 312-S. Each respective ADC stage 302 provides the respective digital value 312 to the register 306. The register 306 accepts or otherwise receives the multiple digital values 312-1 to 312-S, with each respective digital value 312 of the multiple digital values 312-1 to 312-S accepted from a respective analog-to-digital conversion stage 302 of the multiple analog-to-digital conversion stages 302-1 to 302-S. The register 306 combines the multiple digital values 312-1 to 312-S to produce the digital output signal 214 for the pipeline ADC 130-1.

A given ADC stage 302 produces a digital value 312 as an output signal thereof based on an input signal for the ADC stage 302. In the case of the first ADC stage 302-1, the stage input signal can correspond to the analog input signal 212. For other ADC stages, the stage input signal can correspond to a respective residue input signal 310 from a preceding ADC stage. In addition to the digital value 312, a given ADC stage 302 can generate an analog residue signal 308 as another output signal. In some implementations, the ADC stage 302 provides the analog residue signal 308 to a next residue amplifier 304. The residue amplifier 304 amplifies the analog residue signal 308 to produce a residue input signal 310 for a succeeding ADC stage 302.

In FIG. 3, the pipeline ADC 130-1 is explicitly depicted with a first analog residue signal 308-1, a first residue input signal 310-1, a second analog residue signal 308-2, and a second residue input signal 310-2. By way of example, the first ADC stage 302-1 generates the first analog residue signal 308-1 and forwards the first analog residue signal 308-1 to the first residue amplifier 304-1. The first residue amplifier 304-1 amplifies the first analog residue signal 308-1 to produce the first residue input signal 310-1. By amplifying the first analog residue signal 308-1, the first residue amplifier 304-1 prepares the analog signal for further digital conversion—e.g., for the bits having less significance than those already converted. The first residue amplifier 304-1 provides the first residue input signal 310-1 to the second ADC stage 302-2. The second ADC stage 302-2 accepts or otherwise receives the first residue input signal 310-1 and produces the second digital value 312-2 based thereon, as well as the second analog residue signal 308-2.

The pipelined operations can continue with additional ADC stages and interlaced residue amplifiers. Although three ADC stages are explicitly shown in FIG. 3, a pipeline ADC 130-1 may include two ADC stages (e.g., where "S" equals "2") or more than three ADC stages. In two-stage cases, the pipeline ADC 130-1 may include a single residue amplifier 304-1 coupled between the first and second ADC stages 302-1 and 302-2. Generally, each ADC stage 302 may be built using a same type of ADC; alternatively, at least some ADC stages may be designed with different types of ADCs. For example, the first ADC stage 302-1 may include an asynchronous digital ramp ADC, while one or more other ADC stages may include a different type of ADC.

Figure 4:
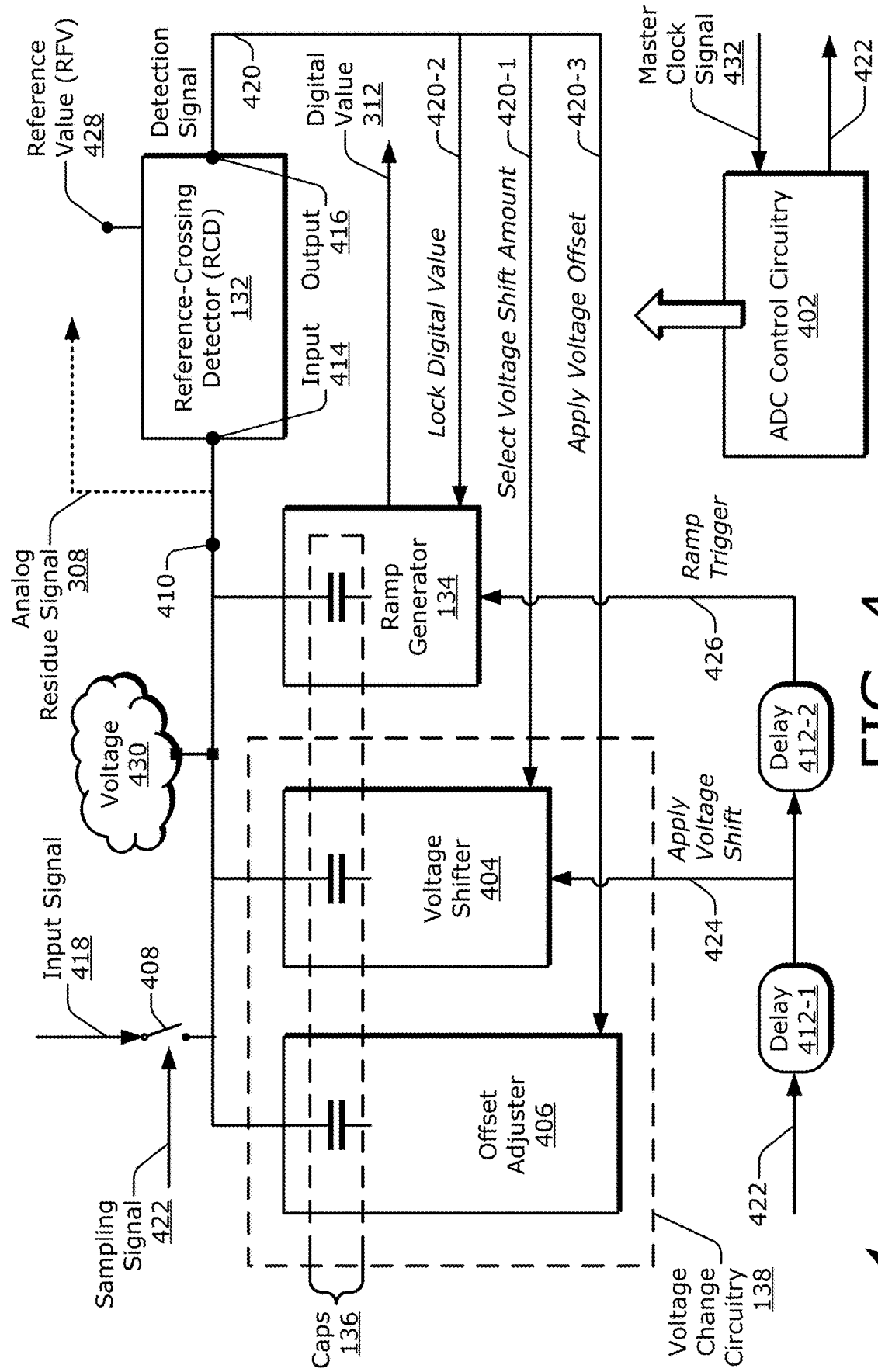
FIG. 4 is a schematic diagram of an example ADC including a reference-crossing detector, a ramp generator, and voltage control circuitry, such as a voltage shifter and/or an offset adjuster.
Figures 1, 4:
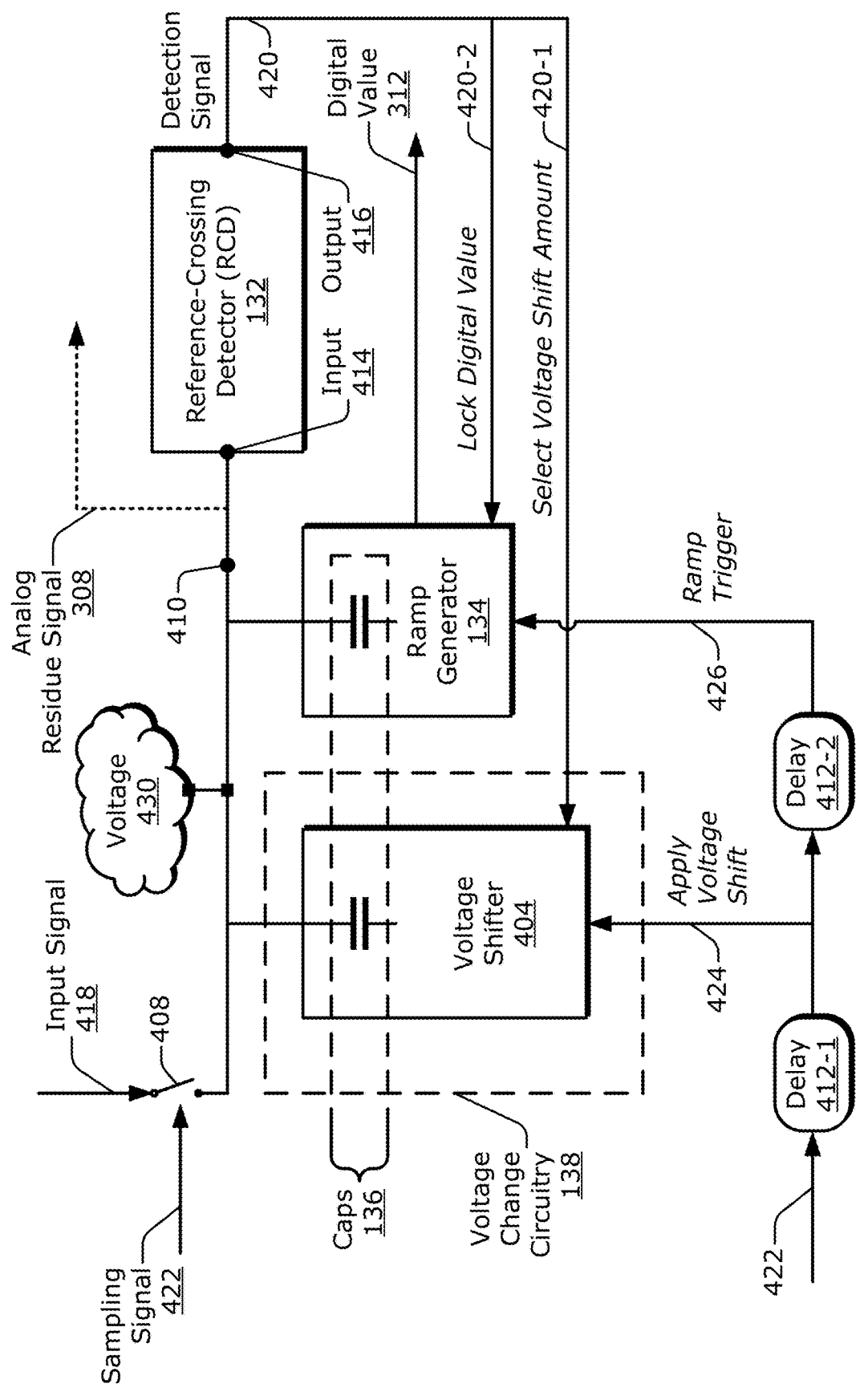
Figures 2, 4:
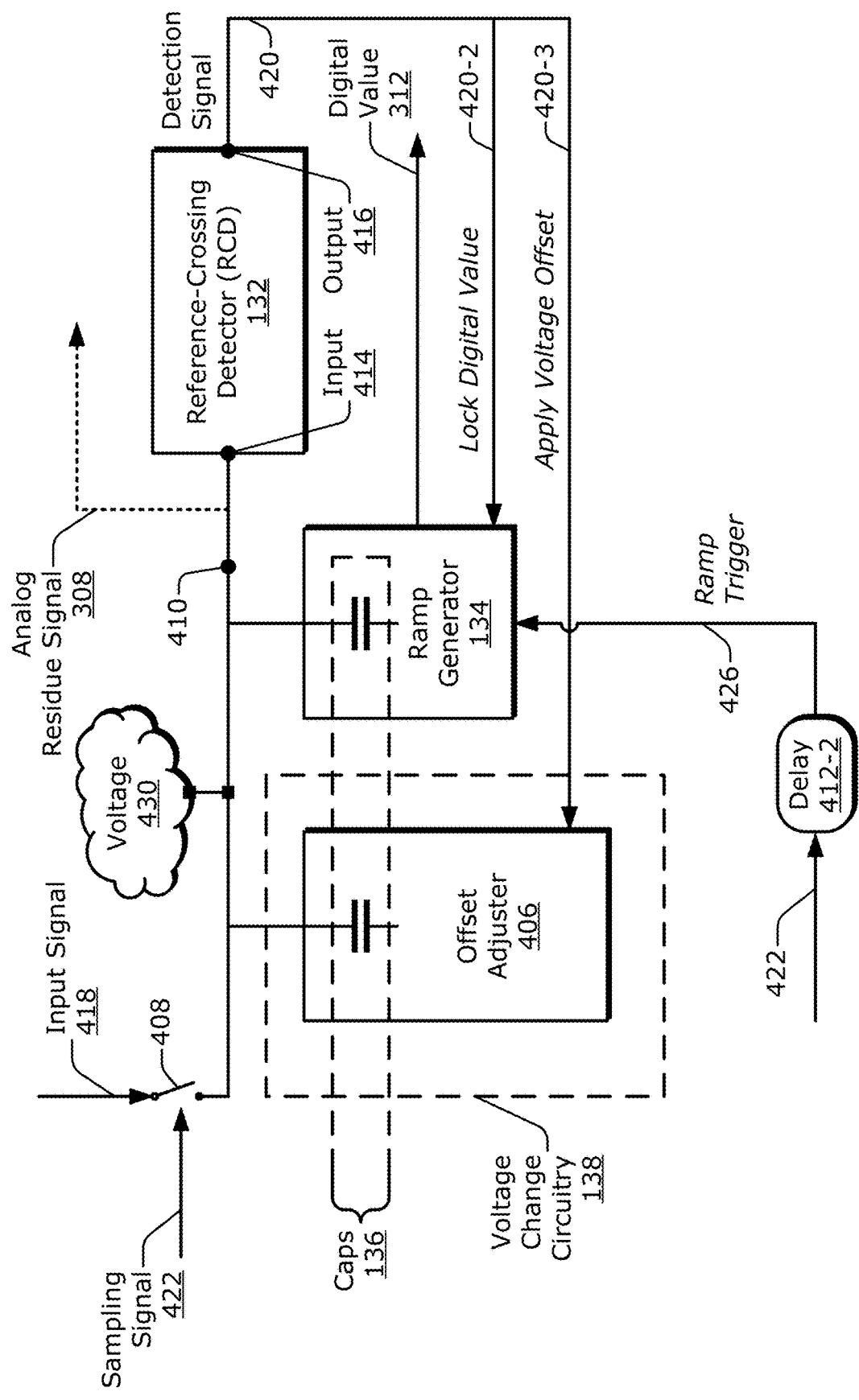

FIG. 4 is a schematic diagram 400 of an example ADC 130 (e.g., of FIGS. 1-3) including a reference-crossing detector 132, a ramp generator 134, and voltage change circuitry 138, such as a voltage shifter 404 and/or an offset adjuster 406. The schematic diagram 400 also includes ADC control circuitry 402; at least one switch 408, which may be referred to as an input switch 408 or a sampling switch 408; and at least one delay unit 412, such as a first delay unit 412-1 and a second delay unit 412-2. The schematic diagram 400 can correspond to an ADC 130 or at least part of an ADC stage 302 of a pipeline ADC 130-1 (e.g., of FIG. 3).

The ADC control circuitry 402, although depicted as a single discrete rectangle, can include logic or components that are distributed around the schematic diagram 400 to provide control functionality to the various illustrated components. Thus, although not explicitly so depicted in the schematic diagram 400, the ADC control circuitry 402 can include logic or control elements of the ramp generator 134, the voltage shifter 404, and/or the offset adjuster 406. Further, although not depicted in this manner in FIG. 4 for clarity, the ADC control circuitry 402 can include at least one delay unit 412. The ADC control circuitry 402 may also include other control circuitry, such as logic for signal routing or gating and/or logic to control a timing for providing a detection signal 420 to the various components. For example, the ADC control circuitry 402 can coordinate or control a forwarding order or an interpretation of different detection signals that are produced by the reference-crossing detector 132. Further, the ADC control circuitry 402 can include logic, such as logic 718 or logic 728 (e.g., of FIG. 7), that is depicted as being part of another component, such as the voltage shifter 404 or the offset adjuster 406, respectively.

In example implementations, the reference-crossing detector 132 includes an input 414 and an output 416. The switch 408 is coupled to the input 414 of the reference-crossing detector 132 via a node 410. The ramp generator 134 can be coupled between the output 416 of the reference-crossing detector 132 and the input 414 of the reference-crossing detector 132. The voltage shifter 404 can be coupled between the output 416 and the input 414 of the reference-crossing detector 132. The offset adjuster 406 can also be coupled between the output 416 and the input 414 of the reference-crossing detector 132.

In some aspects, the multiple capacitors 136 can be distributed across two or more of the following components: the ramp generator 134, the voltage shifter 404, or the offset adjuster 406. The capacitors 136 can be realized using, for example, at least one capacitor digital-to-analog converter (DAC), such as at least one capacitive DAC 136 (or cap DAC 136). Each capacitor of the multiple capacitors 136 can be coupled to the input 414 of the reference-crossing detector 132 via the node 410. As described herein, each respective component—the ramp generator 134, the voltage shifter 404, or the offset adjuster 406—can affect a voltage of the node 410 at the input 414 of the reference-crossing detector 132 as part of an ADC operation.

In example operations, the ADC of the schematic diagram 400 receives an input signal 418 at the node 410 via the switch 408. The input signal 418 can correspond to the analog input signal 212 (of FIGS. 2 and 3) or a residue input signal 310 (of FIG. 3). Responsive to the switch 408 being closed, the input 414 of the reference-crossing detector 132 is exposed to a voltage of the input signal 418. A sampling signal 422 controls operation of the switch 408. The sampling signal 422 can close the switch 408 based on the sampling signal becoming active (e.g., being driven high or low depending on a transistor technology of the switch 408) to obtain a sampled signal. While the switch 408 is in a closed state responsive to the sampling signal 422, the voltage of the input signal 418 can be stored on the one or more capacitors 136.

The ADC control circuitry 402 can generate the sampling signal 422 based on a master clock signal 432. In some cases, a master clock signal 432 at least partially controls a timing of the operations of circuitry that includes an ADC 130. The ADC control circuitry 402 may condition or adjust a timing of the master clock signal 432 to produce the sampling signal 422. The master clock signal 432 can be applied, for instance, to the first ADC stage 302-1 (e.g., of FIG. 3), and then the first ADC stage 302-1 can trigger the next component (e.g., the first residue amplifier 304-1) such that component operation is cascaded asynchronously along the pipeline ADC 130-1, starting with the first ADC stage 302-1. Alternatively, a respective version or derivative of the master clock signal 432 can be individually applied to each component block of the pipeline ADC 130-1 (of FIG. 3) to synchronously control ADC operations. After a time period that is sufficient to transfer the voltage of the input signal 418 to the one or more capacitors 136 has elapsed, the ADC control circuitry 402 can use the sampling signal 422 to open the switch 408.

The reference-crossing detector 132 (RCD 132) produces a signal, such as a detection signal 420, based on a reference value 428 and responsive to a voltage 430 at the input 414. Thus, the reference-crossing detector 132 can produce the detection signal 420 based on the input signal 418 and the reference value 428. For example, the reference-crossing detector 132 can set a value of the detection signal 420 based on whether the voltage of the input signal 418 (or the voltage 430 otherwise at the node 410) is greater than or less than the reference value 428. The reference-crossing detector 132 can be realized, for instance, as an asynchronous comparator that compares the voltage 430 at the input 414 to the reference value 428, which may correspond to a reference voltage level. In some cases, the reference-crossing detector 132 can be implemented as a zero-crossing detector (ZCD) in which the ZCD outputs a signal responsive to an input signal crossing an approximately zero voltage or a ground voltage. In these cases, the reference value 428 can correspond to the approximately zero voltage or the ground voltage. In some implementations, the reference-crossing detector 132 can be realized using an analog amplifier that is operated like a digital asynchronous comparator. A positive input voltage at the input 414 drives the detection signal 420 at the output 416 to an upper voltage rail, which can correspond to a high voltage (or a logical "1" value). A negative input voltage at the input 414 drives the detection signal 420 at the output 416 to a ground voltage level, which can correspond to a low voltage (or a logical "0" value).

Figure 6:
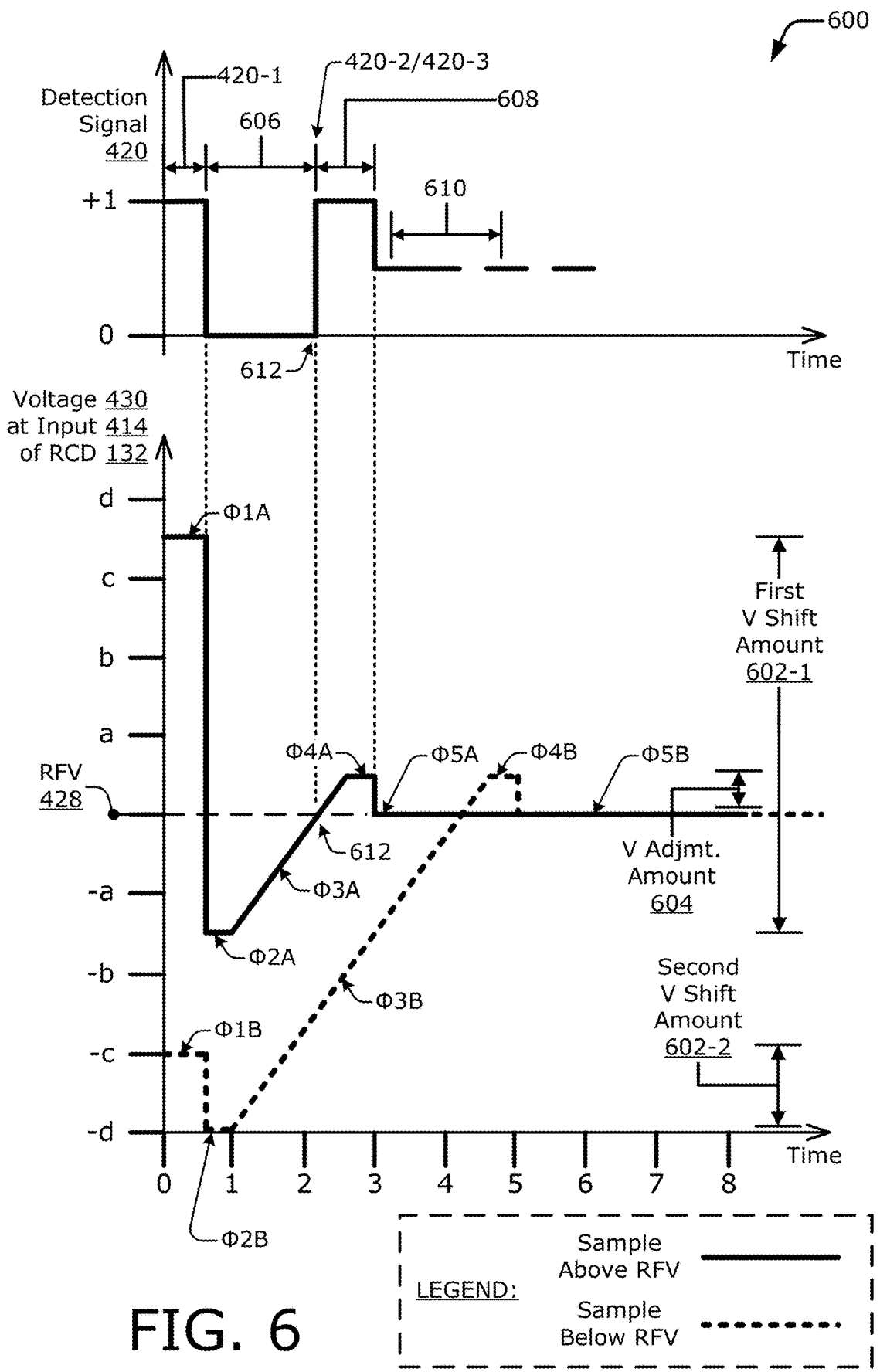
FIG. 6 depicts two graphs: a lower graph of voltage versus time illustrating example voltage levels at an input/output node of an ADC that uses a voltage shifter and an offset adjuster and an upper graph illustrating example voltage values resulting from a comparison of voltages using a reference-crossing detector.
Figure 7:
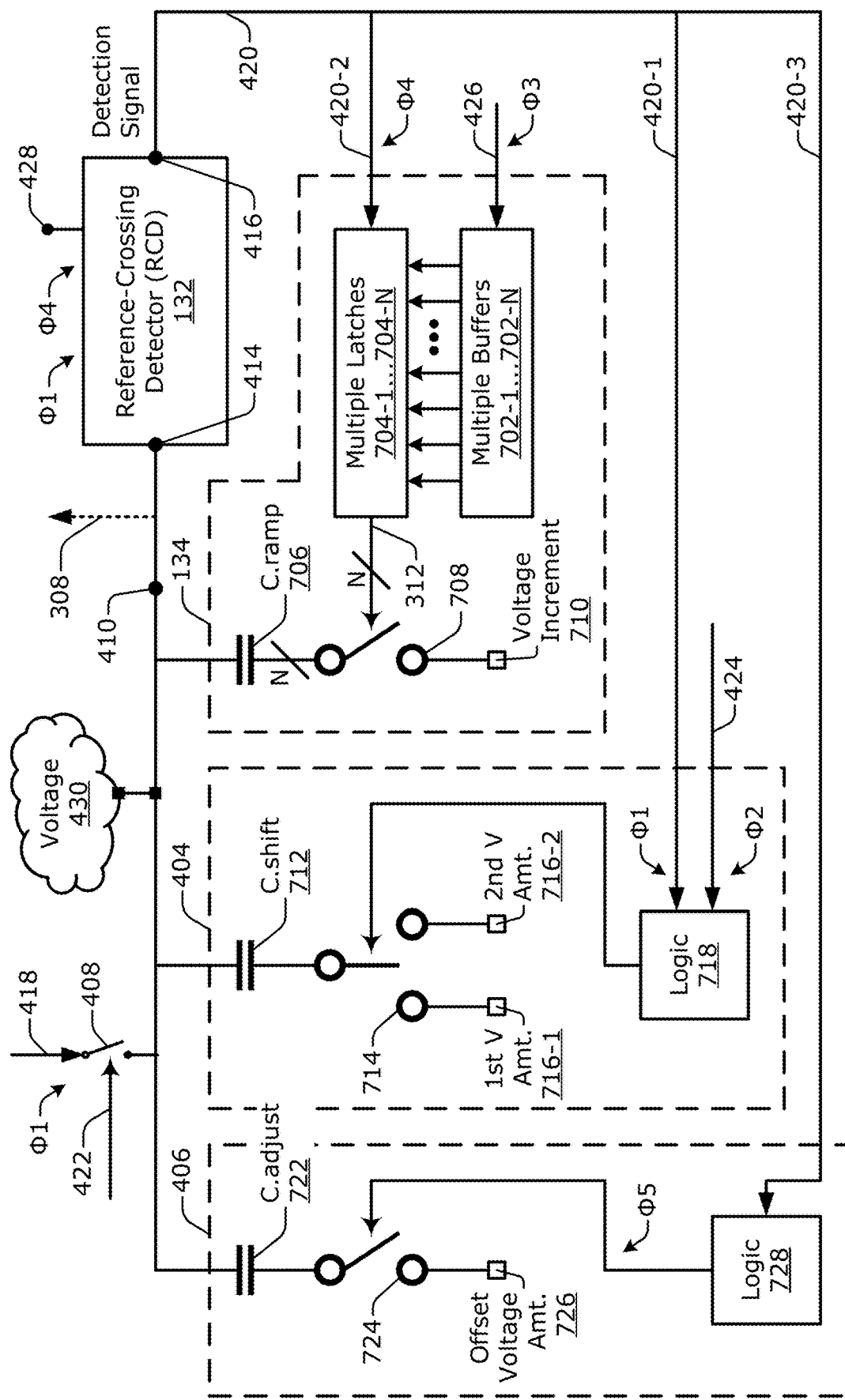
FIG. 7 is a circuit diagram of an example ADC including a reference-crossing detector, a ramp generator, and a voltage shifter or an offset adjuster.
Figure 9:
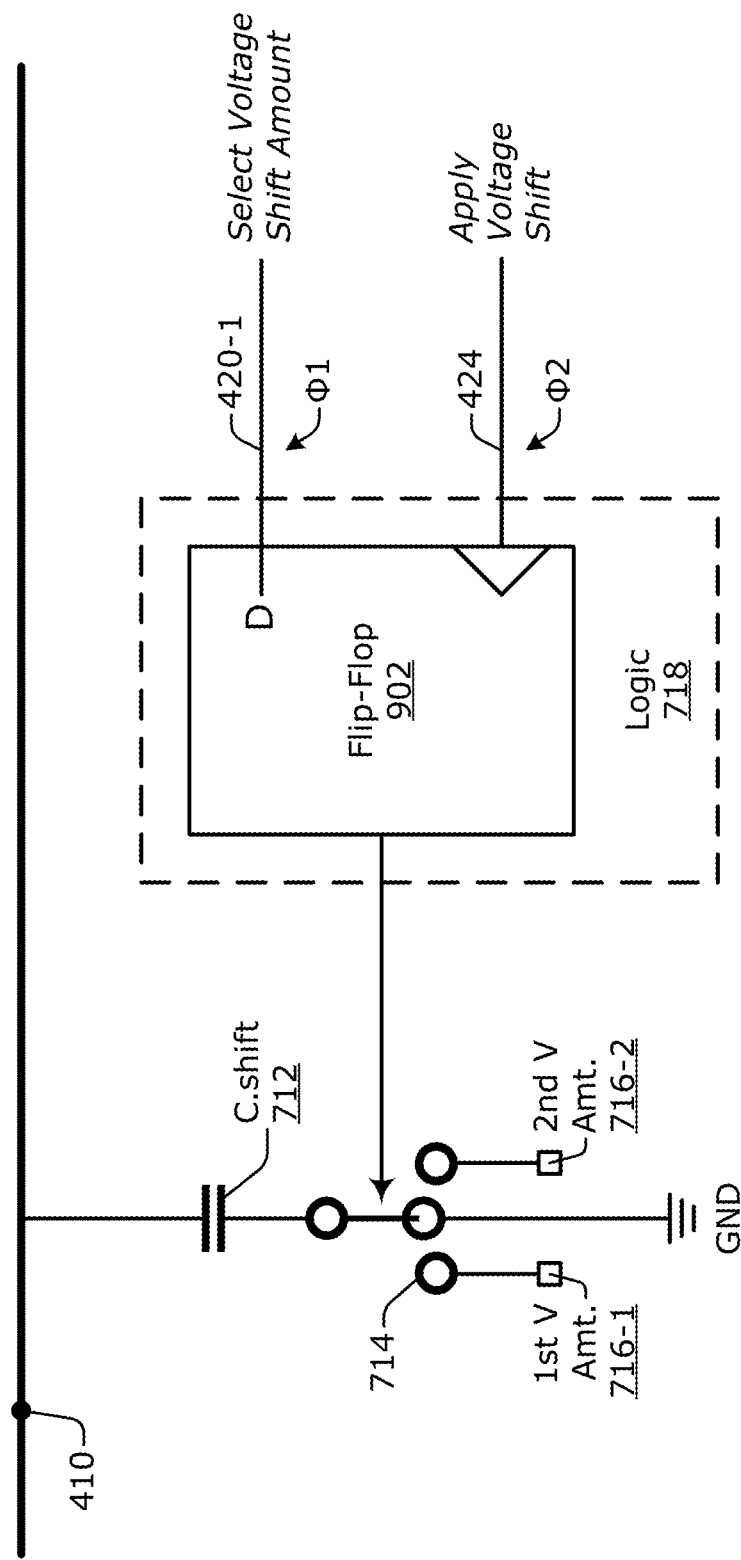
FIG. 9 is a circuit diagram of an example voltage shifter.
Figure 10:
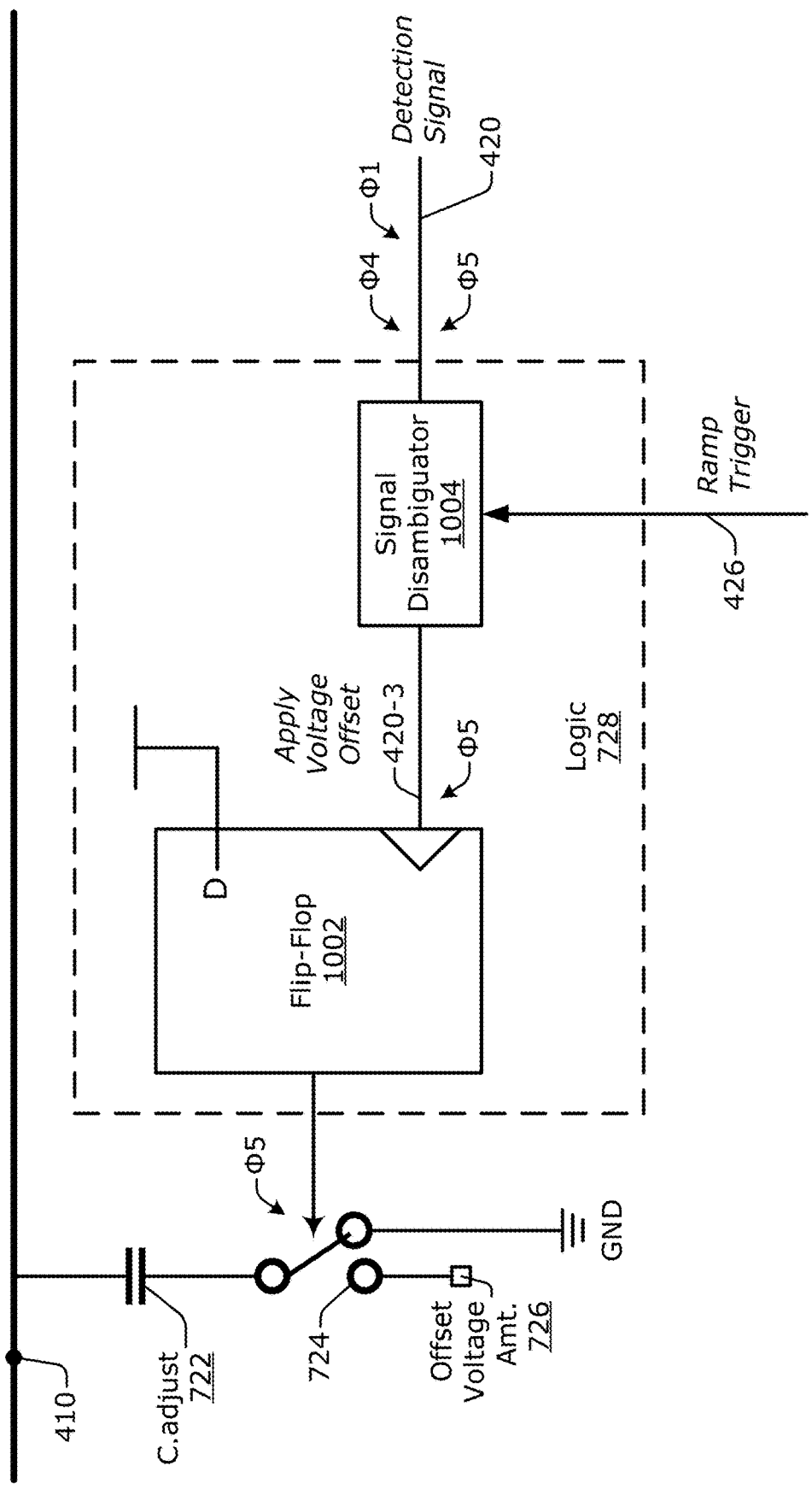
FIG. 10 is a circuit diagram of an example offset adjuster.

The detection signal 420 can correspond to any of multiple different signals depending on signal destination, context, relative time, or phase of operation of the ADC, which may be controlled by the ADC control circuitry 402 and/or other logic described herein, such as the one or more delay units 412, the logic 718 (e.g., of FIGS. 7 and 9), and/or the logic 728 (e.g., of FIGS. 7 and 10). Example signal versions of the detection signal 420 include a select voltage shift amount signal 420-1 at a first time, a lock digital value signal 420-2 at a second time, and/or an apply voltage offset signal 420-3 at a third time. Thus, the detection signal 420 can be interpreted or used differently depending on destination and/or a relative time during each ADC cycle. Examples of such times are described below with reference to FIG. 6. As shown, the reference-crossing detector 132 provides the select voltage shift amount signal 420-1 to the voltage shifter 404. The reference-crossing detector 132 provides the lock digital value signal 420-2 to the ramp generator 134. The reference-crossing detector 132 provides the apply voltage offset signal 420-3 to the offset adjuster 406.

Meanwhile, the ADC control circuitry 402, via at least one delay unit 412, can produce one or more additional signals based on the sampling signal 422. As shown, the first delay unit 412-1 produces an apply voltage shift signal 424 based on the sampling signal 422. The first delay unit 412-1 can provide the apply voltage shift signal 424 to the voltage shifter 404. The second delay unit 412-2 produces a ramp trigger signal 426 based on the apply voltage shift signal 424, which can be based on the sampling signal 422. Alternatively, the second delay unit 412-2 may produce the ramp trigger signal 426 "directly" from the sampling signal 422. In such cases, the second delay unit 412-2 may produce the ramp trigger signal 426 based on the sampling signal 422 using a longer delay period as compared to that of the first delay unit 412-1 so that the ramp trigger signal 426 is issued after the apply voltage shift signal 424. The second delay unit 412-2 can provide the ramp trigger signal 426 to the ramp generator 134.

To affect the voltage 430 at the node 410 or the input 414 of the reference-crossing detector 132, the ramp generator 134 can generate a digital ramp or ramping signal. The ramp generator 134 ramps the voltage 430 responsive to the ramp trigger signal 426 and can terminate the ramping process responsive to the lock digital value signal 420-2. The ramp generator 134 may include components at least analogous to those of a time-to-digital converter (TDC) that are coupled to an array of capacitors. Example components of the ramp generator 134 are described below with reference to FIGS. 7 and 8. The locked digital value that results from the ramping can be output as the digital value 312 (e.g., also of FIGS. 3, 7, and 8).

The voltage shifter 404 shifts the voltage 430 at the node 410 or the input 414 of the reference-crossing detector 132 based on the select voltage shift amount signal 420-1 and responsive to the apply voltage shift signal 424. The offset adjuster 406 can adjust the voltage 430 at the node 410 or the input 414 responsive to the apply voltage offset signal 420-3 and based on an offset voltage amount. The offset voltage amount can be determined through a calibration process, which is described below with reference to FIG. 12.

Thus, in example operations, the voltage 430 can be established based on the input signal 418 and the ramp generator 134. The voltage 430 can further be established or changed based on operation of the voltage change circuitry 138, such as the operations of the voltage shifter 404 or the offset adjuster 406. Responsive to operation of such components (e.g., two or more of these components) in accordance with one of the orders described herein, the ADC generates the voltage 430 at the node 410 or the input 414 of the reference-crossing detector 132. The ADC can produce the voltage 430 as another output signal. In a pipeline ADC 130-1 environment, the output signal can function as an analog residue signal 308 (e.g., of FIG. 3), which provides a residue voltage for forwarding as an input signal to a succeeding ADC stage 302 or to an intervening residue amplifier 304 (of FIG. 3). With a pipelined analog-to-digital converter 130-1, the input 414 of the reference-crossing detector 132 can operate as an input for a given ADC stage 302 at a first time, and the same input 414 can provide an output for that ADC stage 302 at a second time.

Figure 5:
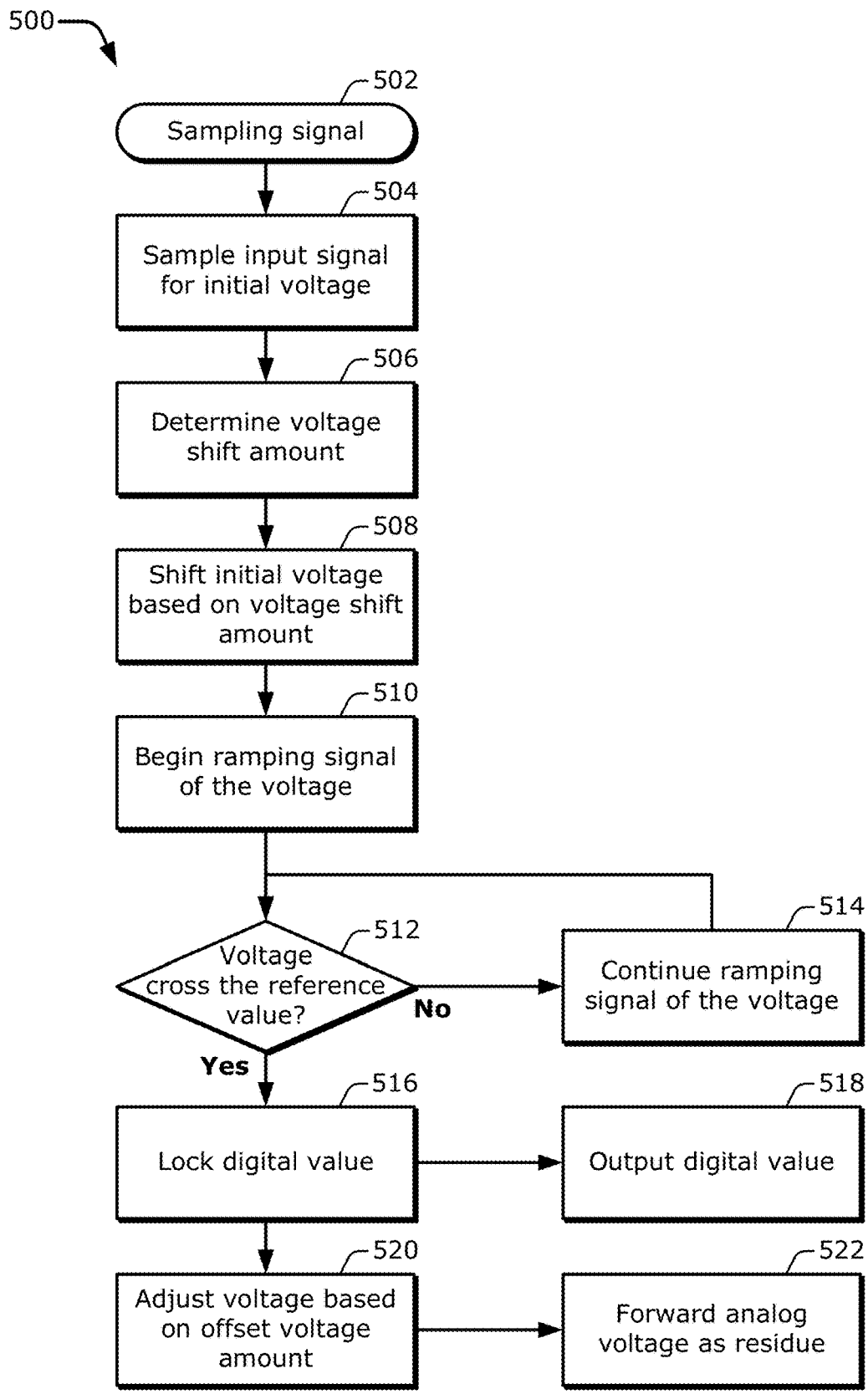
FIG. 5 is a flow chart illustrating an example process for operating an ADC like that of FIG. 4 with a voltage shift and a voltage offset adjustment.

FIG. 5 is a flowchart illustrating example processes 500 for operating an ADC 130 like that of FIG. 4 with a voltage shift and a voltage offset adjustment. The flowchart of the processes 500 includes eleven (11) blocks 502-522. In example implementations, the processes 500 depict techniques for operating the ADC of FIG. 4 in particular orders. Operation of an ADC may, however, be performed using more, fewer, and/or different actions or using actions in a different order. Further, the actions may be performed in fully or partially overlapping manners.

At block 502, the sampling signal 422 closes the switch 408 and permits the input signal 418 to reach the node 410 and the input 414 of the reference-crossing detector 132. Accordingly, at block 504, the ADC samples the input signal 418 to establish an initial voltage level of the voltage 430 at the node 410.

At block 506, the reference-crossing detector 132 determines a voltage shift amount and indicates the selected voltage shift amount with the detection signal 420 at the output 416 of the reference-crossing detector 132. The voltage shift amount determination can be based on the voltage 430 and the reference value 428. The voltage shift amount is selected from at least two voltage shift amount candidates. The ADC can select a voltage shift amount that ensures that a voltage of a ramping signal will approach the reference value 428 but that is not shifted so far from the reference value 428 that the ramping time is extended. Example voltage shift amount options are described below with reference to FIG. 6.

At block 508, the voltage shifter 404 shifts the voltage 430 based on the select voltage shift amount signal 420-1 and responsive to the apply voltage shift signal 424. In some aspects, after the voltage 430 is shifted, the voltage ramping can be started. At block 510, the ramp generator 134 begins a ramping signal that alters the voltage 430 at the input 414 of the reference-crossing detector 132 responsive to the ramp trigger signal 426. As described herein, the ramping signal can be realized as a digital ramp that increases the voltage 430 in quantized steps using a capacitor array coupled to the node 410.

At block 512, the reference-crossing detector 132 determines if the voltage 430 crosses the reference value 428. While the voltage 430 does not reach the reference value 428, the ramping signal can continue at block 514 to alter (e.g., increase or decrease) the voltage 430 (e.g., for a positive ramp or a negative ramp, respectively). The reference-crossing detector 132 can likewise continue to detect whether the voltage 430 crosses the reference value 428 at block 512 as part of a process loop. Responsive to the voltage 430 crossing the reference value 428, the reference-crossing detector 132 detects the crossing and changes the value of the detection signal 420, which corresponds to the lock digital value signal 420-2 in this phase of operation.

At block 516, the reference-crossing detector 132 issues the lock digital value signal 420-2 to the ramp generator 134 and causes the ramp generator 134 to stop increasing the ramping signal. Accordingly, the voltage 430 can cease increasing at the node 410. Further, the ramp generator 134 can output a digital value 312 to a register 306 (e.g., both of FIG. 3) at block 518. The digital value 312 can represent at least a portion of a digital output signal 214 of the ADC.

Due to signal propagation or circuit operation latency, the voltage 430 may exceed the reference value 428 before the ramp signal is stopped. This voltage overshoot can complicate operation of a succeeding ADC stage by limiting an amplification range for an intervening residue amplifier 304. To reduce the voltage overshoot, at block 520 the offset adjuster 406 adjusts the voltage 430 based on an offset voltage amount responsive to the apply voltage offset signal 420-3. The ADC can forward the resulting level of the voltage 430 as a residue signal (e.g., an analog residue signal 308 of FIG. 3) to a downstream component of a pipeline ADC 130-1 at block 522.

FIG. 4-1 is a schematic diagram 400-1 of an example ADC 130 (e.g., of FIGS. 1-3) including a reference-crossing detector 132, a ramp generator 134, and a voltage shifter 404. In example implementations, an apparatus can include an ADC 130 as described herein. The reference-crossing detector 132 includes an input 414 and an output 416. The ramp generator 134 is coupled between the output 416 of the reference-crossing detector 132 and the input 414 of the reference-crossing detector 132. The voltage shifter 404 is coupled between the output 416 of the reference-crossing detector 132 and the input 414 of the reference-crossing detector 132.

FIG. 4-2 is a schematic diagram 400-2 of an example ADC 130 (e.g., of FIGS. 1-3) including a reference-crossing detector 132, a ramp generator 134, and an offset adjustor 406. In example implementations, an apparatus can include an ADC 130 as described herein. The reference-crossing detector 132 includes an input 414 and an output 416. The ramp generator 134 is coupled between the output 416 of the reference-crossing detector 132 and the input 414 of the reference-crossing detector 132. The offset adjuster 406 is coupled between the output 416 of the reference-crossing detector 132 and the input 414 of the reference-crossing detector 132.

FIG. 6 illustrates two graphs generally at 600. A lower graph (lower two-thirds of the figure) shows voltage versus time illustrating example voltage levels at an input/output node of an ADC that uses a voltage shifter and an offset adjuster. An upper graph (upper one-third of the figure) shows voltage versus time illustrating example voltage values resulting from a comparison of the voltages in the lower graph. The lower graph depicts voltage along the ordinate or vertical axis, with the voltage corresponding to the voltage 430 at the input 414 of the reference-crossing detector 132. The voltage axis depicts the reference value 428 and four voltage levels "a" up to "d" that are higher than the reference value 428 and four voltage levels "-a" down to "-d" that are lower than the reference value 428. Time increases along the abscissa or horizontal axis in a rightward direction from zero (0) to eight (8) or more temporal units. The upper graph depicts voltage along the vertical axis with the voltage corresponding to the detection signal 420 at the output 416 of the reference-crossing detector 132. The lower graph is primarily described first, and the upper graph with the detection signal 420 is described further below.

As indicated by the legend, the solid thick lines correspond to an initial voltage level that is above the reference value 428, and the dashed thick lines correspond to an initial voltage level that is below the reference value 428. These graphed thick lines represent the voltage 430 across five phases ($\Phi1$ to $\Phi5$) of operation. The solid thick lines have phases indicated with a capital "A" (phases $\Phi A$ to $\Phi 5A$), and the dashed thick lines have phases indicated with a capital "B" (phases $\Phi 1B$ to $\Phi 5B$).

In example implementations, a first phase $\Phi1$ corresponds to a determination of the initial voltage level of the input signal 418 by the reference-crossing detector 132. A second phase $\Phi2$ corresponds to a voltage shift that is performed by the voltage shifter 404 prior to a ramping of the voltage by the ramp generator 134. A third phase $\Phi3$ corresponds to a ramping of the voltage 430 by the ramp generator 134. A fourth phase $\Phi4$ corresponds to the locking of the digital value and the voltage overshoot by the ramp generator 134, in conjunction with determinations by the reference-crossing detector 132. A fifth phase $\Phi5$ corresponds to the voltage offset adjustment by the offset adjuster 406.

Two example voltage shift amounts are shown: a first voltage amount 602-1 (or first voltage shift amount 602-1) and a second voltage amount 602-2 (or second voltage shift amount 602-2). As depicted, one voltage amount is different from another voltage amount to account for different initial voltage levels of the input signal 418. For instance, the first voltage amount 602-1 (or first amount) for an initial positive voltage level is greater than the second voltage amount 602-2 (or second amount) for an initial negative voltage level. This ensures that the voltage level after a shift from an initial positive voltage level starts ramping at a voltage level that is below the reference value 428. The multiple voltage levels can also shorten a ramping period by reducing how far a voltage ramps before reaching the reference value 428 when the initial voltage level is "already" below the reference value 428. By reducing the ramping period in these manners, the ADC operation can be completed more quickly.

In the example operative environment for the graph 600, the ramp generator 134 produces a positive ramp. Thus, the voltage 430 increases during the third phase $\Phi3$. The techniques described herein can, however, be applied with a negative ramp in which a digital ramp decreases the voltage 430 in the third phase $\Phi3$. In such cases, the relative sizes of the first and second voltage amounts 602-1 and 602-2 can be reversed such that the smaller of the two is applied to (e.g., added to) an initial positive voltage level of the input signal 418. The voltage levels of the graph 600 are further described with joint reference to FIGS. 6 and 7. For clarity, certain example implementations are described with a reference value 428 of approximately zero volts or a ground level. The reference value 428 can, however, correspond to another voltage level, such as one that is near zero volts (e.g., a few millivolts (mV)) or one that is relatively further from zero volts (e.g., 100 or 200 mV).

FIG. 7 is a circuit diagram 700 of an example ADC including a reference-crossing detector 132, a ramp generator 134, and a voltage shifter 404 or an offset adjuster 406. The circuit diagram 700 depicts additional example circuitry for certain components of the schematic diagram 400 of FIG. 4. FIG. 7 also illustrates the phases $\Phi1$ to $\Phi5$ of FIG. 6 at example relevant locations. Each of the ramp generator 134, the voltage shifter 404, and the offset adjuster 406 includes at least one respective switch. Each of the ramp generator 134, the voltage shifter 404, and the offset adjuster 406 also includes at least one respective capacitor, which may be part of the multiple capacitors 136 (e.g., of FIGS. 1 and 4). The depicted components may also include logic that is part of the ADC control circuitry 402 (e.g., of FIG. 4). The logic may be realized with circuitry (e.g., passive circuit elements, active circuit elements such as one or more transistors, logic gates, flip-flops or latches, and delay elements) that is designed, fabricated, or otherwise implemented to perform the functions described herein.

In example implementations, the ramp generator 134 can include multiple buffers 702-1 . . . 702-N and multiple latches 704-1 . . . 704-N, with "N" representing a positive integer. Generally, the multiple buffers 702-1 to 702-N are respectively coupled to the multiple latches 704-1 to 704-N. The buffers of the multiple buffers 702-1 to 702-N may be coupled together in series. The ramp generator 134 also includes at least one capacitor—a ramp capacitor 706 (C.ramp 706)—and at least one switch 708. A first side or a first terminal of the ramp capacitor 706 is coupled to the input 414 of the reference-crossing detector 132. A second side or a second terminal of the ramp capacitor 706 is coupled to at least one voltage rail, which provides at least one voltage increment amount 710. The voltage ramping rail can be held at a voltage increment amount 710 that corresponds to a granularity for increasing or decreasing the ramping signal at the node 410. The "N" latches 704-1 to 704-N can be coupled to the at least one switch 708 via "N" wires to control respective states (e.g., an open state or a closed state) of the one or more switches 708. These "N" wires may provide the digital value 312, which is output by the "N" latches 704-1 to 704-N. In some cases, the ramp generator 134 includes "N" switches 708 and "N" ramp capacitors 706. Example implementations of the ramp generator 134 are described below with reference to FIG. 8.

The voltage shifter 404 can include at least one capacitor—a shift capacitor 712 (C.shift 712)—and at least one switch 714. The shift capacitor 712 is coupled between the node 410 and the switch 714. A first terminal of the shift capacitor 712 is coupled to the input 414 of the reference-crossing detector 132. The at least one switch 714 is coupled between (i) a second terminal of the shift capacitor 712 and (ii) a first voltage rail or a second voltage rail. The at least one switch 714 may be realized as, for instance, a single-pole, double-throw (SPDT) switch. The ADC control circuitry 402 or another component can hold the first voltage rail at a first voltage amount 716-1 and the second voltage rail to a second voltage amount 716-2. The first voltage amount 716-1 can correspond to the first voltage shift amount 602-1 (of FIG. 6), and the second voltage amount 716-2 can correspond to the second voltage shift amount 602-2. Each voltage amount 716 may be provided using a direct current (DC) voltage. The voltage shifter 404 can also include logic 718 to control a state of the switch 714. The logic 718 can coordinate or control the switch 714 based on the apply voltage shift signal 424 and the select voltage shift amount signal 420-1. Thus, at least one capacitor, such as the shift capacitor 712; at least one switch, such as the switch 714; and the logic 718 can jointly comprise the voltage shifter 404. Example implementations of the voltage shifter 404 are described below with reference to FIG. 9.

The offset adjuster 406 can include at least one capacitor—an adjustment capacitor 722 (C.adjustment 722)—and at least one switch 724. The adjustment capacitor 722 is coupled between the node 410 and the switch 724. A first terminal of the adjustment capacitor 722 is coupled to the input 414 of the reference-crossing detector 132. The at least one switch 724 is coupled between a second terminal of the adjustment capacitor 722 and at least one voltage rail. The ADC control circuitry 402 or another component can hold the voltage rail at an offset voltage amount 726. The offset voltage amount 726 (or offset voltage level) can correspond to the offset voltage adjustment amount 604 (or offset voltage adjustment level) (of FIG. 6). The voltage amount 726 may be provided using a direct current (DC) voltage. The offset adjuster 406 can also include logic 728 to control a state of the switch 724. The logic 728 can coordinate or control the switch 724 based on the apply voltage offset signal 420-3. Thus, at least one capacitor, such as the adjustment capacitor 722; at least one switch, such as the switch 724; and the logic 728 can jointly comprise the offset adjustor 406. Example implementations of the offset adjuster 406 are described below with reference to FIG. 10.

For clarity, the switches of FIG. 7 are shown being open and capable of being closed to connect a respective capacitor to a respective voltage source or voltage level. For example, the at least one switch 708, the at least one switch 714, and the at least one switch 724 are each shown as "starting" in an open state. Each of these switches, however, can have an initial state that connects a terminal of the respective capacitor to a known voltage level—such as a direct current voltage (DC voltage) or a ground. For instance, the switch 724 can disconnect the second terminal of the adjustment capacitor 722 from the ground and connect the second terminal of the adjustment capacitor 722 to the offset voltage amount 726. This is shown more explicitly in FIGS. 8-10 and described further below. Each at least one switch can be realized as a single switch, as multiple switches (e.g., as at least two switches, such as a first switch and a second switch), as a single pole multiple throw switch (e.g., as a single pole dual throw (SPDT) switch), or as some combination thereof. Each switch or portion thereof may be implemented using at least one transistor, such as a field-effect transistor (FET).

This document now describes example operations of the circuit diagram 700 with reference to the operational phases Φ1 to Φ5, which are also depicted in FIG. 6. For simplicity, this description is provided in the context of a positive ramping process with a reference value 428 that is zero volts. The associated principles, however, are applicable to a negative ramping process or to a reference value 428 that is non-zero. Prior to the first phase Φ1 starting or at least completing, the sampling signal 422 causes the switch 408 to close. Once the voltage of the input signal 418 is transferred to the node 410, the sampling signal 422 can open the switch 408, and the first phase Φ1 can commence, complete, or otherwise occur. The node 410 thus samples the voltage of the input signal 418 as a sampled signal and as the initial voltage level for the voltage 430. Operation is described first for an input signal 418 that is positive, which corresponds to phases Φ1A to Φ5A of FIG. 6.

The reference-crossing detector 132 compares the initial voltage to a zero voltage (e.g., which is analogous to the operation of a zero-crossing detector (ZCD)). If the initial voltage is positive, the reference-crossing detector 132 generates a first value for the detection signal 420. At the first phase Φ1A, the select voltage shift amount signal 420-1 is driven at the first value at the output 416 of the reference-crossing detector 132. The logic 718 of the voltage shifter 404 accepts or otherwise receives the select voltage shift amount signal 420-1 at the first value. Based on the first value, the logic 718 is to set the switch 714 to connect the shift capacitor 712 to the first voltage rail at the first voltage shift amount 716-1.

At the second phase Φ2A, the apply voltage shift signal 424 can be produced as a delayed version of the sampling signal 422—e.g., after a delay by the first delay unit 412-1. Responsive to activation of the apply voltage shift signal 424, the logic 718 connects the second plate of the shift capacitor 712 to the first voltage rail in accordance with the first value of the select voltage shift amount signal 420-1. This causes the voltage 430 at the input 414 of the reference-crossing detector 132 to be shifted downward (e.g., decreased) by the first voltage shift amount 602-1 at the second phase Φ2A. After the voltage shift, the voltage 430 can be ramped. Another delay, or a single longer delay, is produced by at least the second delay unit 412-2. This longer delay results in the ramp trigger signal 426, which can also be based on the sampling signal 422. At the third phase Φ3A, the ADC control circuitry 402 couples the ramp trigger signal 426 to a first or initial buffer of a series of buffers formed by the multiple buffers 702-1 to 702-N.

As the pulse ripples through the multiple buffers 702-1 to 702-N, corresponding ones of the multiple latches 704-1 to 704-N are activated or provided with a voltage value corresponding to the pulse. The activated latches of the multiple latches 704-1 to 704-N use the digital value 312 to close corresponding ones of the switches 708. Each closed switch 708 connects another ramping capacitor 706 to the at least one voltage rail being held at the voltage increment amount 710. Accordingly, each closed switch 708 increases the voltage 430 at the input 414 of the reference-crossing detector 132. This causes the voltage 430 to ramp upward (e.g., to increase or climb in this example). Although the ramping is shown as a smooth line in FIG. 6, the digital ramping process may include quantized steps.

Eventually, the ramping voltage of the voltage 430 at the input 414 of the reference-crossing detector 132 crosses the reference value 428, which is zero volts in this example. In response to this reference-value crossing, the reference-crossing detector 132 can change the value of the detection signal 420 to produce the lock digital value signal 420-2 at the fourth phase Φ4A. The lock digital value signal 420-2 has a value that causes respective latches of the multiple latches 704-1 to 704-N to lock to whatever value from respective buffers of the multiple buffers 702-1 to 702-N is currently being coupled thereto. This terminates the ramping of the voltage 430 at the node 410 by preventing any more switches 708 from being closed.

As shown in FIG. 6, at the fourth phase Φ4A and the fourth phase Φ4B, the voltage 430 at the input 414 overshoots the reference value 428. Here, with the reference value 428 being zero volts, the voltage 430 at the node 410 is above the zero voltage. This can narrow a dynamic range for the handling of residue signals in a succeeding ADC stage due to amplification constraints for the adjacent downstream residue amplifier 304. Accordingly, the offset adjuster 406 can reduce the absolute value of the voltage 430 relative to a zero-volt reference value 428 or lower the magnitude of the voltage overshoot generally. At the fifth phase Φ5A, the logic 728 interprets the detection signal 420 that is set by the crossing of the reference value 428 as the apply voltage offset signal 420-3. Responsive to accepting or otherwise receiving the apply voltage offset signal 420-3 from the reference-crossing detector 132, the logic 728 causes the switch 724 to close and thereby couple the second terminal of the adjustment capacitor 722 to the at least one voltage rail having the offset voltage amount 726. This lowers the voltage 430 at the node 410 by the voltage adjustment amount 604 as shown in FIG. 6 to cause the voltage 430 to approach zero volts.

ADC operations for the first through the fifth phases Φ1B to Φ5B for input signals 418 that are negative are analogous to the operations for the first through the fifth phases Φ1A to Φ5A for input signals 418 that are positive, as described above. However, the first and second phases Φ1B and Φ2B are different from the first and second phases Φ1A and Φ2A. At the first phase Φ1B, the reference-crossing detector 132 determines that the initial voltage level for the voltage 430 is negative. The positive ramping process that targets a zero-volt reference value 428 can therefore be completed faster (assuming a constant ramping rate) if the downward voltage shift has a smaller amount as compared to a larger amount. To enable this different voltage shift amount, based on the initial voltage being negative (or, more generally, less than the reference value 428), the reference-crossing detector 132 generates a second value for the detection signal 420. At the first phase Φ1B, the select voltage shift amount signal 420-1 is driven at a second value at the output 416 of the reference-crossing detector 132.

The logic 718 of the voltage shifter 404 accepts the select voltage shift amount signal 420-1 at the second value. Based on the second value, the logic 718 is to set the switch 714 to connect the shift capacitor 712 to the at least one second voltage rail at the second voltage shift amount 716-2. At the second phase Φ2B, the apply voltage shift signal 424 can be produced as a delayed version of the sampling signal 422—e.g., after a delay by the first delay unit 412-1. Responsive to activation of the apply voltage shift signal 424, the logic 718 connects the second plate of the shift capacitor 712 to the second voltage rail. This causes the voltage 430 at the input 414 of the reference-crossing detector 132 to be shifted downward (e.g., decreased) by the second voltage shift amount 602-2 at the second phase Φ2B. After the voltage shift, the voltage 430 can be ramped at the third phase Φ3B. The reference-crossing detector 132 detects the signal crossing at the fourth phase Φ4B and terminates the ramping with the lock digital value signal 420-2. The offset adjuster 406 corrects for the voltage overshoot using the offset adjustment amount 726 for the fifth phase Φ5B.

The upper graph of FIG. 6 depicts an example of the detection signal 420 versus time in relation to the example voltages of the lower graph. In example implementations, the detection signal 420 is a function of the voltage 430 and the reference value 428. For instance, the reference-crossing detector 132 can produce the detection signal 420 based on a comparison of the voltage 430 relative to the reference value 428. As shown in the upper graph for this example, the reference-crossing detector 132 outputs a higher voltage level ("+1") responsive to the voltage 430 being higher than the reference value 428 and a relatively lower voltage level ("0") responsive to the voltage 430 being lower than the reference value 428.

By way of example, the detection signal 420 of the upper graph tracks the voltages for the situation in which the sample signal 122 is above the reference value 428, but the signal analysis is analogous when the sample signal 122 is below the reference value 428. During the first phase Φ4A, the detection signal 420 corresponds to the select voltage shift amount signal 420-1 and has the relatively higher voltage value. The select voltage shift amount signal 420-1 at least partially controls the voltage shifter 404 responsive to the apply voltage shift signal 424 as is explained above and described further below with respect to FIG. 9. During the second phase Φ2A, the detection signal 420 is depicted during a period 606 as having the relatively lower voltage value, but the ADC 130 is not controlled by the detection signal 420 during this period 606. The period 606 extends into the third phase Φ3A until the ramping signal crosses the reference value 428. At this time 612, the voltage 430 exceeds the reference value 428, and the detection signal 420 climbs to the higher voltage value at the end of the period 606.

As shown in the upper graph, this rising edge of the detection signal 420 corresponds to the lock digital value signal 420-2 and the apply voltage offset signal 420-3. The lock digital value signal 420-2 at least partially controls the ramp generator 134 as is explained above and described further below with reference to FIG. 8. As described below for FIG. 8, the rising edge of the detection signal 420 can cause the lock digital value signal 420-2 to be gated relative to the multiple latches 704-1 to 704-N of the ramp generator 134 to prevent subsequent changes to the detection signal 420 from unlocking the latches. The apply voltage offset signal 420-3 at least partially controls the offset adjuster 406 as is explained above and described further below with reference to FIG. 10.

The detection signal 420 remains at the relatively higher voltage level during a period 608 through the fourth phase Φ4A until the offset adjuster 406 returns the voltage 430 to the reference value 428. During the fifth phase Φ5A, the voltage 430 is approximately equal to the reference value 428. With ideal circuitry, the detection signal 420 would have a determinable value (e.g., a zero-volt input would produce a zero-volt output, or the voltage would take a middle level of 0.5*voltage level of the voltage rail). With physical circuitry, however, the value of the detection signal 420 during a period 610 may be undefined. As noted above, the lock digital value signal 420-2 can be gated from the multiple latches 704-1 to 704-N before the period 610 begins so that the digital value 312 remains locked. Sometime after the fifth phase Φ5A begins, a current ADC cycle can be completed, and a new cycle can be started using the sampling signal 422.

Figure 8:
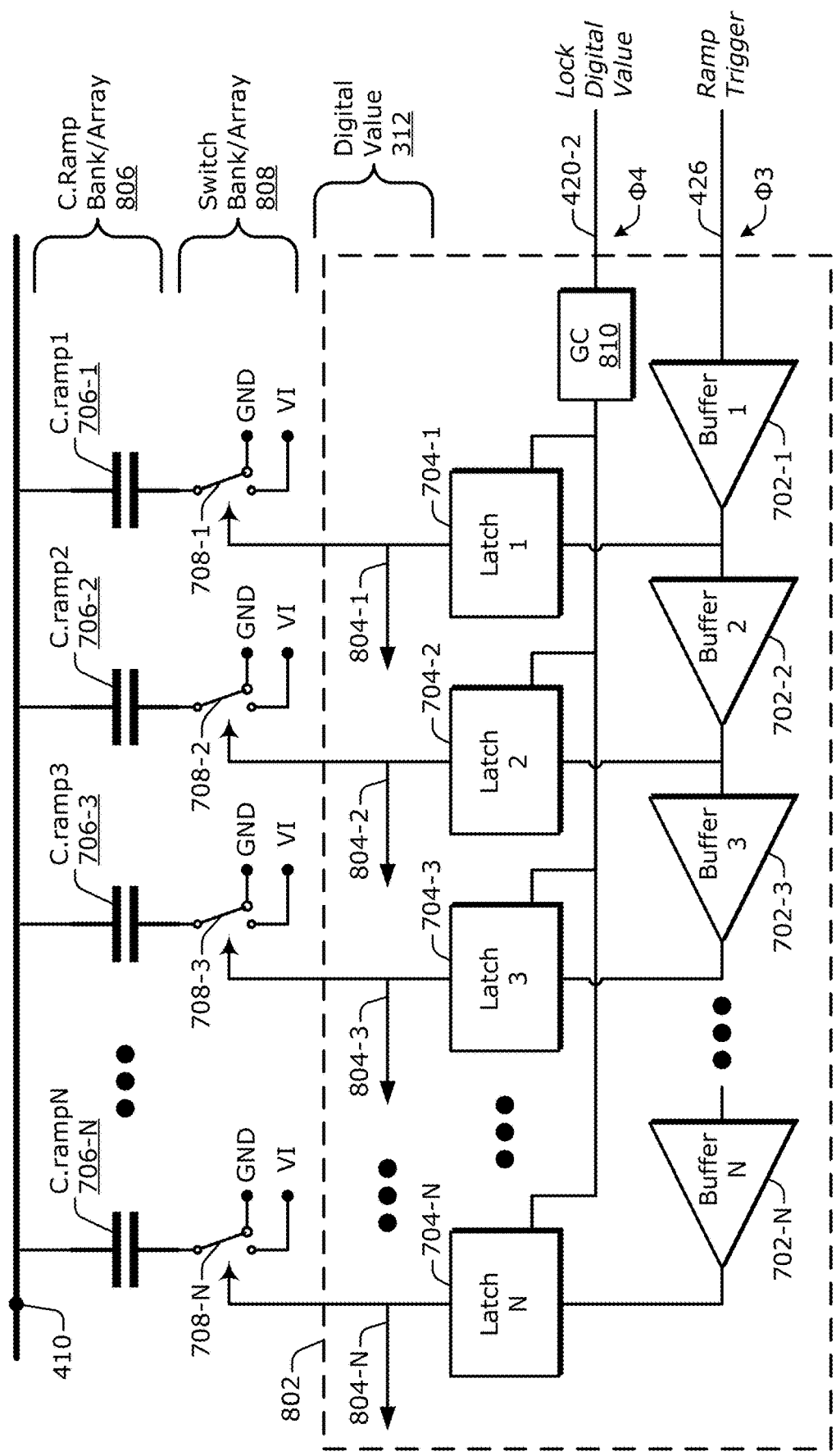
FIG. 8 is a circuit diagram of an example ramp generator.

FIG. 8 is a circuit diagram 800 of an example ramp generator 134 (e.g., of FIGS. 4 and 7). In example implementations, the ramp capacitor 706 may be implemented as a capacitive bank 806 or capacitor array 806. The capacitor array 806 includes a first ramp capacitor 706-1 (C.ramp1 706-1), a second ramp capacitor 706-2 (C.ramp2 706-2), a third ramp capacitor 706-3 (C.ramp3 706-3), . . . , an "Nth" ramp capacitor 706-N (C.rampN 706-N). Each ramp capacitor 706 of the capacitor array 806 is coupled to the node 410.

The switch 708 may be implemented as a switch bank 808 or switch array 808. The switch array 808 includes a first ramp switch 708-1, a second ramp switch 708-2, a third ramp switch 708-3, . . . , an "Nth" ramp switch 708-N.

As shown, each respective ramp capacitor 706 of the multiple ramp capacitors 706-1 to 706-N is coupled between a respective ramp switch 708 of the multiple ramp switches 708-1 to 708-N and the node 410. Each ramp switch 708 can be coupled between a respective ramp capacitor 706 and at least one voltage rail corresponding to a voltage level, such as a voltage increment (VI) amount to increase the ramp at each step. The respective ramp capacitor 706 can also be coupled to a ground voltage (GND), which is described below. The multiple ramp capacitors 706-1 to 706-N can be encoded in any of multiple different manners, such as with thermometer encoding.

The multiple buffers 702-1 to 702-N are shown coupled together in series as a first buffer 702-1 (Buffer 1), a second buffer 702-2 (Buffer 2), a third buffer 702-3 (Buffer 3), . . . , an "Nth" buffer 702-N (Buffer N). A buffer, such as an initial buffer or the first buffer 702-1, receives the ramp trigger signal 426 from the ADC control circuitry 402 (e.g., using at least one delay unit 412) at the third phase Φ3. A pulse ripples through the series-connected buffers from the first buffer 702-1 toward the "Nth" buffer 702-N. In some cases, each buffer 702 can be realized using differential circuitry. With two parallel buffer chains for differential signaling, latch control signals for the multiple latches 704-1 to 704-N can be extracted from the multiple buffers 702-1 to 702-N from alternating buffer chains such that each buffer 702 can be formed from a single inverter per plus buffer chain and per minus buffer chain.

The multiple latches 704-1 to 704-N are shown with a first latch 704-1 (Latch 1), a second latch 704-2 (Latch 2), a third latch 702-3 (Latch 3), . . . , an "Nth" latch 704-N (Latch N). Each respective latch 704 can include two inputs and one output. A first input of each respective latch 704 of the multiple latches 704-1 to 704-N is coupled to an output of a respective buffer 702 of the multiple buffers 702-1 to 702-N. Thus, the multiple latches 704-1 to 704-N can track the progress of the pulse propagating through the multiple buffers 702-1 to 702-N. A second input of each latch 704 of the multiple latches 704-1 to 704-N is coupled to receive the lock digital value signal 420-2. Responsive to activation of the lock digital value signal 420-2, each respective latch 704 of the multiple latches 704-1 to 704-N latches the output signal of the respective buffer 702 of the multiple buffers 702-1 to 702-N at the fourth phase Φ4. In some aspects, the multiple buffers 702-1 to 702-N and the multiple latches 704-1 to 704-N can be coupled together in a manner similar to a time-to-digital converter 802 (TDC 802).

As described above with reference to FIG. 6, the lock digital value signal 420-2 goes high at time 612 at the end of the period 606. This relatively higher voltage can cause the multiple latches 704-1 to 704-N to lock. The lock digital value signal 420-2 may, however, drop to the relatively lower voltage or an undefined level during the period 610. To prevent this change to the lock digital value signal 420-2 from affecting the locking time (and thus potentially the digital value 312), a gating circuit 810 (GC 810) can be coupled between the reference-crossing detector 132 (e.g., of FIG. 4) and the respective second inputs of the multiple latches 704-1 to 704-N. The gating circuit 810 can selectively determine when or whether the multiple latches 704-1 to 704-N are sensitive to, or affected by, the lock digital value signal 420-2. For example, the gating circuit 810 can decouple the multiple latches 704-1 to 704-N from the lock digital value signal 420-2 for a remainder of an ADC cycle responsive to the lock digital value signal 420-2 going high and after some delay period that permits the locking.

As illustrated in FIG. 8, each respective switch 708 of the multiple switches 708-1 to 708-N is coupled between a respective latch 704 of the multiple latches 704-1 to 704-N and a respective ramp capacitor 706 of the multiple ramp capacitors 706-1 to 706-N. For example, the output of each latch 704 of the multiple latches 704-1 to 704-N can be coupled to a control input of each switch 708 of the multiple switches 708-1 to 708-N. The output of each respective latch 704 of the "N" latches 704-1 to 704-N corresponds to a respective digital value bit 804 of "N" digital value bits 804-1 to 804-N. Thus, the first latch 704-1 can output a first digital value bit 804-1, the second latch 704-2 can output a second digital value bit 804-2, the third latch 704-3 can output a third digital value bit 804-3, . . . the "Nth" latch 704-N can output an "Nth" digital value bit 804-N. The digital value 312 can include at least a portion of the "N" digital value bits 804-1, 804-2, 804-3, . . . , 804-N. The digital value bit 804 that is output from each latch 704 can, therefore, control whether the corresponding switch 708 is opened or closed (e.g., can establish an open state or a closed state for the respective switch 708).

As the triggered pulse propagates through the multiple buffers 702-1 to 702-N, the corresponding ones of the multiple latches 704-1 to 704-N close corresponding ones of the multiple switches 708-1 to 708-N. As each switch 708 is closed, a second terminal of the corresponding ramp capacitor 706 is coupled to a voltage level. Consequently, a first terminal of the corresponding ramp capacitor 706 can increase the voltage 430 (for positive ramping) on the node 410 to ramp the voltage 430 at the input 414 of the reference-crossing detector 132.

In some cases, at least one switch 708 "initially" couples the corresponding ramp capacitor 706 to the ground (GND) or another DC voltage as an "initial" voltage level. As a pulse traverses a portion of the multiple latches 704-1 to 704-N, the at least one switch 708 uncouples the ramp capacitor 706 from the ground (GND) and couples the ramp capacitor 706 to the voltage increment (VI). This changes a voltage that the respective ramp capacitor 706 "applies" to the node 410. Here, the at least one switch 708 can include a first switch that opens (e.g., a first transistor that is turned off) to disconnect a second terminal of the ramp capacitor 706 from the ground and a second switch that closes (e.g., a second transistor that is turned on) to connect the second terminal of the ramp capacitor 706 to the voltage increment. A switch 708, however, may be implemented in alternative manners.

Thus, the time-to-digital converter 802 of a ramp generator 134 can encode a digital value 312 (e.g., of FIG. 3) representative of at least a portion of a digital output signal 214 of an analog-to-digital converter 130 in respective states of respective latches of the multiple latches 704-1 to 704-N, in respective states of respective switches of the multiple switches 708-1 to 708-N, or in a combination thereof. The multiple capacitors 706-1 to 706-N can convert the digital value 312 to an analog version to ramp the voltage 430 at the node 410. The ramp generator 134 is described with reference to FIG. 8 using TDC-type circuitry. The ramp generator 134, however, may be realized differently. For example, a ramp generator 134 may be implemented using a binary-weighted capacitor array, an operational-amplifier-based analog integrator, or a fixed current source coupled to a capacitor.

FIG. 9 is a circuit diagram 900 of an example voltage shifter 404 (e.g., of FIGS. 4 and 7). The circuit diagram 900 illustrates an example implementation of the logic 718. As shown, the logic 718 can include at least one flip-flop 902. The flip-flop 902 is realized as a "D" flip-flop (DFF) in this example. A data input (e.g., the "D" input) is coupled to the output 416 of the reference-crossing detector 132 to accept or otherwise receive the select voltage shift amount signal 420-1 at the first phase Φ1. A clocking input "<" of the "D" flip-flop 902 is coupled to circuitry that provides the apply voltage shift signal 424, such as the first delay unit 412-1. An output of the "D" flip-flop 902 is coupled to a control terminal of the switch 714.

In example operations, the position of the switch 714—for a first voltage level or a second voltage level—is selected by the reference-crossing detector 132 in the first phase Φ1 using the select voltage shift amount signal 420-1. This establishes a voltage shift amount for the second phase Φ2. Responsive to activation of the apply voltage shift signal 424 (e.g., with a rising or falling edge), the "D" flip-flop 902 transfers the value on the "D" input to the output of the flip-flop. Thus, the logic 718 can control the state of the switch 714 to select between at least two voltage shift amounts. Responsive to the signal received from the logic 718, the switch 714 can selectively change a second terminal of the shift capacitor 712 from being coupled to the ground voltage to being coupled to the first voltage amount 716-1 or the second voltage amount 716-2. In operation, at the beginning of each ADC cycle, the ADC control circuitry 402 (of FIG. 4) can reset the flip-flop 902 and position the at least one switch 714 to connect the second terminal of the shift capacitor 712 to the ground.

In alternative implementations, the reference-crossing detector 132 and the voltage shifter 404 may assign initial voltage levels of the input signal 418 into more than two categories or ranges. For example, a voltage shifter 404 may have three or four voltage shift amounts that are assigned based on how far (above or below) an initial voltage level is relative to the reference value 428. This can reduce an amount of time the ramping process consumes during the third phase Φ3 to reach the reference value 428 after the voltage shift at the second phase Φ2. In such cases, the logic 718 can be modified to handle finer gradations of initial voltage levels (e.g., beyond two categories corresponding to positive and negative values, or besides less than or greater than zero volts). The select voltage shift amount signal 420-1 can therefore have more than two bits in such cases to differentiate among more than two voltage shift amounts.

FIG. 10 is a circuit diagram 1000 of an example offset adjuster 406. The circuit diagram 1000 illustrates an example implementation of the logic 728. As shown, the logic 728 can include at least one flip-flop 1002. The flip-flop 1002 is realized as a "D" flip-flop (DFF) in this instance. A data "D" input is coupled to a fixed value, such as a supply voltage. The output of the "D" flip-flop 1002 is coupled to a control terminal of the switch 724. With reference to FIGS. 6 and 7, the switch 724 is to be closed at the fifth phase Φ5 after termination of the ramping process at the fourth phase Φ4 of operation. Accordingly, a clocking input "<" of the flip-flop 1002 is to be triggered responsive to the apply voltage offset signal 420-3 at the fifth phase Φ5. In this context, the at least one switch 724 is closed to connect a second terminal of the adjustment capacitor 722 to the offset voltage amount 726. The at least one switch 724 (e.g., using first and second switches realized using first and second transistors) can also be opened to disconnect the second terminal of the adjustment capacitor 722 from the ground based on the signal received from the flip-flop 1002.

The reference-crossing detector 132, however, outputs the detection signal 420 with the purpose or meaning of this signal changing in different phases of the ADC operation. As shown in FIGS. 7 and 10, the detection signal 420 is relevant at the first, fourth, and fifth phases Φ1, Φ4, and Φ5. The logic 728 includes circuitry, such as a signal disambiguator 1004, to ensure that the relevant transition of the detection signal 420 is applied to the clocking input of the flip-flop 1002. In example operations, the signal disambiguator 1004 therefore gates the select voltage shift amount signal 420-1 for the first phase Φ1.

In contrast, the signal disambiguator 1004 passes the apply voltage offset signal 420-3 to the clocking input at the fifth phase Φ5. To do this, the signal disambiguator 1004 can, for example, pass the detection signal 420 to the clocking input of the flip-flop 1002 as the apply voltage offset signal 420-3 after the ramp trigger signal 426 is activated for the third phase Φ3. In such cases, the ramp trigger signal 426 can be routed to the signal disambiguator 1004. As an alternative timing approach, after the detection signal 420 transitions as the lock digital value signal 420-2 at the fourth phase Φ4, the signal disambiguator 1004 can introduce a delay period (e.g., using another delay unit 412). After the delay period, the signal disambiguator 1004 can provide the detection signal 420 as the apply voltage offset signal 420-3 to the clocking input of the flip-flop 1002 at the fifth phase Φ5. In operation, at the beginning of each ADC cycle, the ADC control circuitry 402 (of FIG. 4) can reset the flip-flop 1002 of the logic 728. This reset can change an output of the flip-flop 1002 from "1" to "0" and thereby position the at least one switch 724 from connecting a second terminal of the adjustment capacitor 722 to the offset voltage amount 726 to connecting the second terminal of the adjustment capacitor 722 to ground. With the adjustment capacitor 722 coupled to ground, or another DC voltage, the apply voltage offset signal 420-3 can apply the calibrated voltage offset amount in the next cycle.

Figure 11:
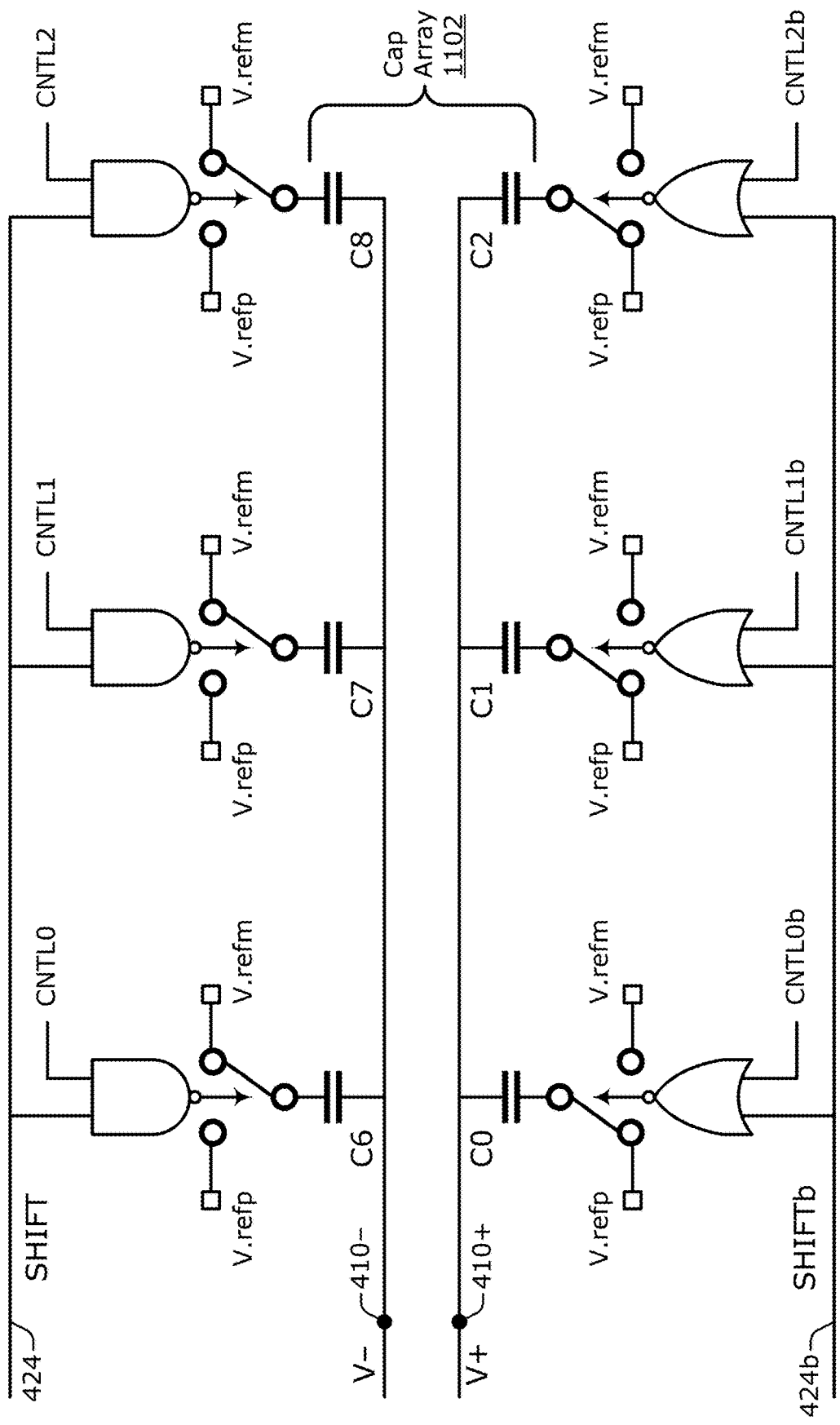
FIG. 11 is an example of a capacitor array that can be used to implement a capacitor of an ADC component in a differential environment.

FIG. 11 illustrates, at 1100 generally, an example of a capacitor array 1102 that can be used to implement a capacitor (e.g., one or more of the capacitors 136 of FIGS. 1 and 4) of an ADC component in a differential environment. The capacitor array 1102 can be used to implement the ramp capacitor 706, the shift capacitor 712, or the adjustment capacitor 722 (e.g., each of FIG. 7). The voltages to which those capacitors can be coupled, such as the offset voltage amount 726 or the first and second voltage shift amounts 716-1 and 716-2, may not be realized using a voltage rail that is directly tied to a power rail or a power management integrated circuit (PMIC). Instead, the voltages for these voltage rails may be created or established in a different manner in some implementations. For example, the DACs of the capacitor arrays can generate these voltages using, for instance, a plus reference voltage V.refp from a plus voltage rail and a minus reference voltage V.refm from a minus voltage rail as described with reference to FIG. 11.

FIG. 11 is described primarily in terms of the voltage shifter 404, but the principles are applicable to other components, including as noted below. In a differential environment, the reference-crossing detector 132 can include a plus input and a minus input for the input 414. In such cases, the voltage 430 can correspond to a plus voltage signal V+ and a minus voltage signal V− (as shown in FIG. 11), and the node 410 can correspond to a plus node 410+ and a minus node 410— (as also shown in FIG. 11). The capacitor array 1102 is shown with six capacitors C0, C1, C2, C6, C7, and C8, but the array may contain more or fewer capacitors. In the lower half of FIG. 11, a first set of capacitors includes the capacitors C0, C1, and C2. These three capacitors are coupled between the plus node 410+ having the plus voltage signal V+ and a differential portion of the apply voltage shift signal 424. A respective NOR gate is coupled between each respective capacitor C0, C1, and C2 and the wire for the apply voltage shift signal_bar 424b (SHIFTb). Each NOR gate has two inputs: a first input coupled to the apply voltage shift signal_bar 424b and a second input coupled to a control bit_bar signal. The control bits bar signals include CNTL0b, CNTL1b, and CNTL2b bits for the capacitors C0, C1, and C2, respectively.

In the upper half of FIG. 11, a second set of capacitors includes the capacitors C6, C7, and C8. These three capacitors are coupled between the minus node 410— having the minus voltage signal V— and a differential portion of the apply voltage shift signal 424. A respective NAND gate is coupled between each respective capacitor C6, C7, and C8 and a wire for the apply voltage shift signal 424 (SHIFT). Each NAND gate has two inputs: a first input coupled to the apply voltage shift signal 424 and a second input coupled to a control bit signal. The control bit signals include CNTL0, CNTL1, and CNTL2 bits for the capacitors C6, C7, and C8, respectively.

At least one respective switch is coupled between each respective capacitor and each respective logical gate (e.g., a NAND gate or a NOR gate). As shown, each respective switch can be realized as a single pole double throw (SPDT) switch. The pole is coupled to a second terminal of each capacitor. Each of the two throws is coupled to a respective differential voltage: the plus reference voltage V.refp or the minus reference voltage V.refm. An output of a respective logical gate controls a state of the SPDT switch. In some cases, the SPDT switch can be implemented with two transistors, such as an n-type FET (nFET) coupled to the V.refm and a p-type FET (pFET) coupled to the V.refp (not shown). In some of such cases, a single signal from the output of the respective logical gate can turn on one FET and turn off the other FET. Each of the at least one switches, however, may be implemented differently. In FIG. 11, the switches are shown pre-positioned to produce a negative voltage shift. Thus, the "lower" (as depicted) switches that are coupled to the plus node 410+, via the capacitors C0, C1, and C2, initially connect these capacitors to the positive reference voltage V.refp. The "upper" switches that are coupled to the minus node 410—, via the capacitors C6, C7, and C8, initially connect these capacitors to the minus reference voltage V.refm.

Although FIG. 11 is described primarily in terms of the voltage shifter 404, the illustrated example binary capacitor DAC can be used to implement at least the shift capacitor 712 or the adjustment capacitor 722. At the start of an ADC cycle, the apply voltage shift signal 424 can be provided the following values: SHIFT=0/SHIFTb=1. These values cause the capacitors connected to the minus voltage signal V— to be connected to V.refm and the capacitors connected to the plus voltage signal V+ to be connected to V.refp. Responsive to a transition of the SHIFT/SHIFTb signal (e.g., the apply voltage shift signal 424 at the second phase Φ2 or the fifth phase Φ5), the logic 718 of the voltage shifter 404 can cause one or more of the capacitors on V+ to change from V.refp to V.refm and one or more of the capacitors on V— to change from V.refm to V.refp. With this example configuration, these connection changes result in a negative differential voltage shift as reflected in FIG. 6.

A magnitude of the voltage shift can be controlled by the CNTL# and CNTL#b bits. For example, if CNTL=010 and CNTLb=101, responsive to the SHIFT signal transitioning from zero to one (0=>1), the connection of the capacitor C7 is changed. The connections of the other illustrated capacitors are unchanged because the other NAND gates have a "0" input. Similarly, when the SHIFTb signal transitions from one to zero (1=>0), the logic 718 can change the connection of the capacitor C1, but the connections of the other capacitors are unchanged because the other NOR gates have a "1" input.

Regarding the voltage shifter 404, the first voltage shift amount 716-1 may be generated with CNTL=001. The second voltage shift amount 716-2 may be generated with CNTL=111. The output of the reference-crossing detector 132 can be mapped to these codes using digital logic—e.g., as part of the ADC control circuitry 402 or the logic 718 thereof. Regarding the offset adjuster 406, the adjustment capacitor 722 can also be implemented using the circuitry of FIG. 11. In this case, the CNTL bits can correspond to a calibration code. An example approach to producing a calibration code is described next.

In some differential implementations, for the voltage shifter 404 or the offset adjuster 406, the at least one switch 714 or 724, respectively, can include multiple switches. Further, the capacitor thereof, (e.g., the shift capacitor 712 or the adjustment capacitor 722, respectively) can be realized using a differential array of capacitors, such as the capacitor array 1102. The differential array of capacitors can include a first set of capacitors (e.g., the capacitors C0, C1, and C2) and a second set of capacitors (e.g., the capacitors C6, C7, and C8). The first voltage rail can comprise a plus voltage rail (e.g., being held to the positive reference voltage V.refp), and the second voltage rail can comprise a minus voltage rail (e.g., being held to the minus reference voltage V.refm). Each respective capacitor of the first set of capacitors includes a first terminal coupled to a plus input (e.g., corresponding to V+ of the plus node 410+) of the reference-crossing detector 132 and a second terminal selectively coupled to the plus voltage rail or the minus voltage rail via a respective first plus switch or a first minus switch of the multiple switches. Here, the illustrated SPDT switches may be implemented using at least two switches, one for each voltage rail. Each respective capacitor of the second set of capacitors includes a first terminal coupled to a minus input (e.g., corresponding to V— of the minus node 410—) of the reference-crossing detector 132 and a second terminal selectively coupled to the plus voltage rail or the minus voltage rail via a respective second plus switch or a second minus switch of the multiple switches. The illustrated SPDT switches may be implemented using at least two switches, such as a plus switch for the plus voltage rail and a minus switch for the minus voltage rail.

Figures 1, 12:
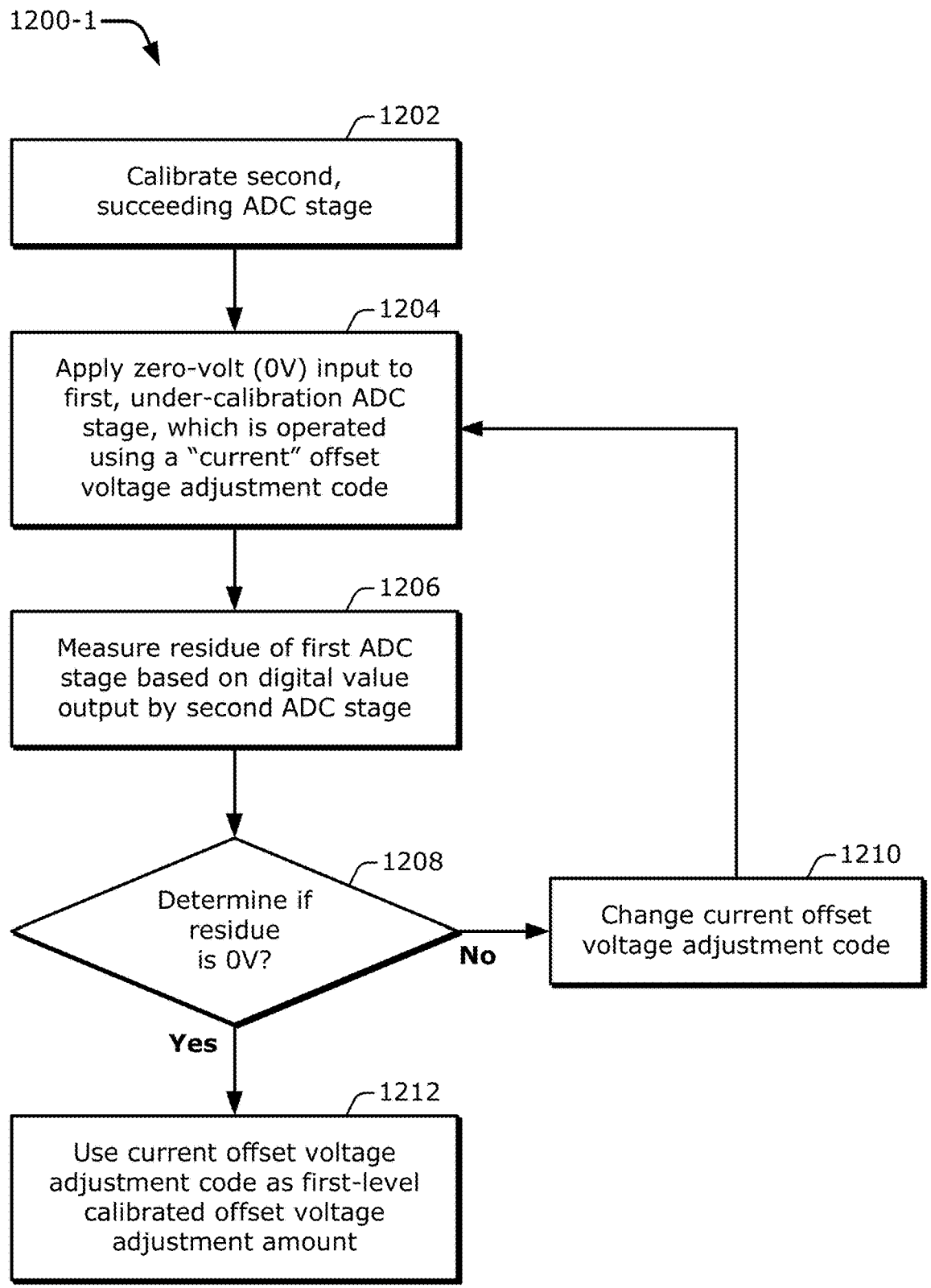
Figures 2, 12:
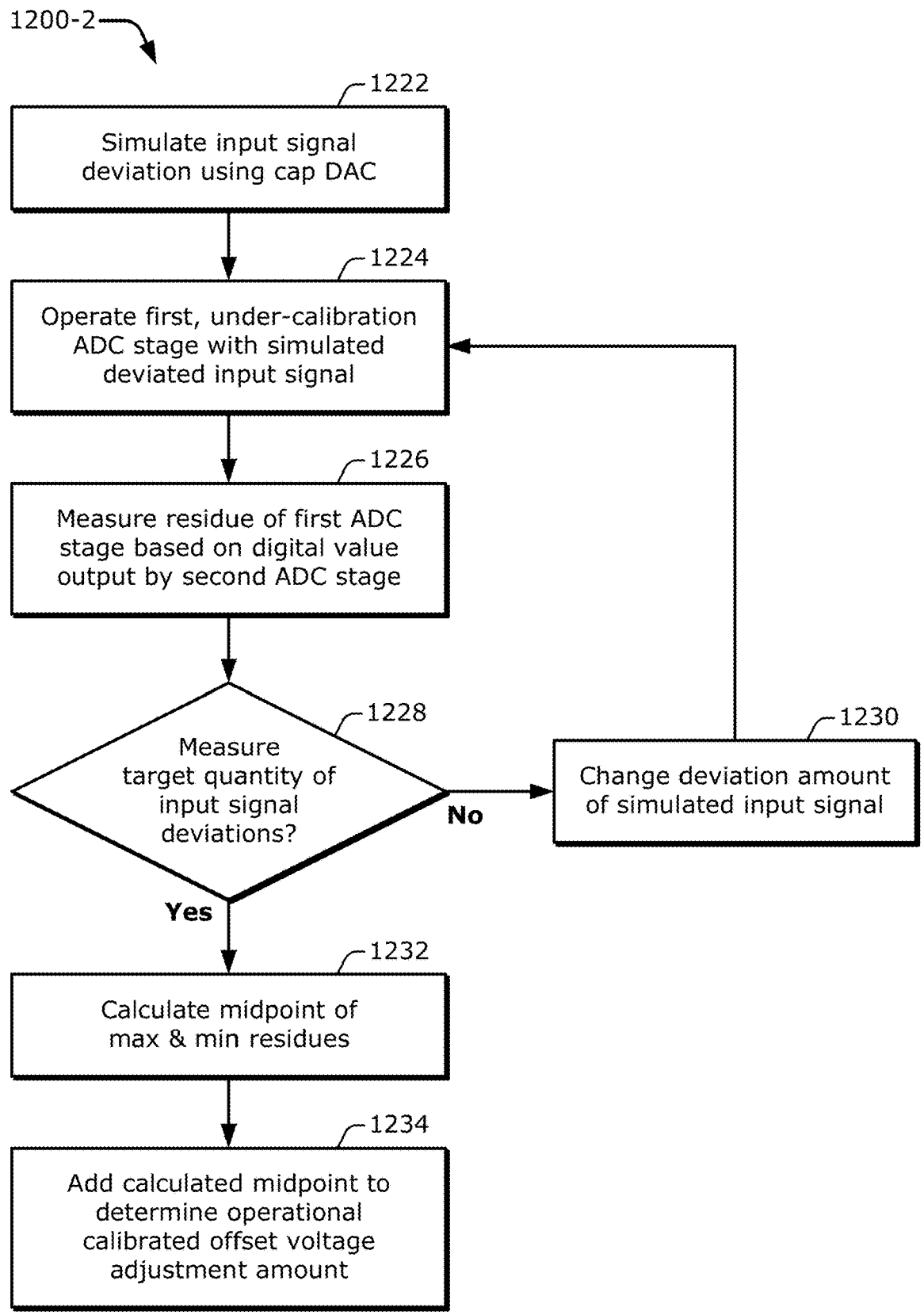

FIGS. 12-1 and 12-2 include respective flowcharts illustrating respective first and second phases of example calibration procedures. FIG. 12-1 is a flowchart illustrating example calibration processes 1200-1 for a first phase for determining an offset voltage amount 726. The processes 1200-1 include six (6) blocks 1202-1212. In example implementations, the processes 1200-1 and 1200-2 depict techniques for determining a voltage adjustment amount 604, as shown in FIG. 6 for the fifth phase Φ5. Calibration procedures may, however, be performed using more, fewer, and/or different actions or using actions in a different order. Further, the actions may be performed in fully or partially overlapping manners. The calibration may be performed responsive to turning an electronic device on or each time an ADC is powered up.

At block 1202, a calibrated ADC is identified or obtained. For example, a succeeding or second ADC stage 302-2 of a pipeline ADC 130-1 may be calibrated. The calibrated second ADC stage 302-2 can be used to calibrate an offset voltage amount 726 for another, previous ADC stage. Alternatively, any currently unengaged or unutilized ADC, which may be separate from the ADC 130, may be employed for calibration. For example, a maintenance or housekeeping ADC or a one-bit ADC (e.g., which can be implemented as a comparator) can be employed. At block 1204, the ADC, such as the ADC control circuitry 402 thereof, applies a zero-volt (0V) input signal 418 to an under-calibration or first ADC stage 302-1 using another ADC, another ADC stage, an amplifier, or other circuitry within the ADC that connects both V+ and V— to the same common mode voltage. The ADC stage 302-1 operates on the zero-volt input signal 418 using some "current" offset voltage adjustment code. Initially, the offset voltage adjustment code may be a default code, such as a minimum code that is to be increased for the calibration or a maximum code that is to be decreased for the calibration. This example is described with a zero initial offset voltage adjustment code. The offset adjustment code can correspond to the control bits (CNTL) for the capacitor array 1102 with an adjustment capacitor 722 implementation of FIG. 11.

At block 1206, the ADC control circuitry 402 measures a residue of the first ADC stage 302-1 based on a digital value 312-2 produced by the second ADC stage 302-2. The application and measurement may be repeated multiple times (e.g., for six iterations) to determine an average residue value. At block 1208, the ADC control circuitry 402 determines if the residue (e.g., the average residue value) equals zero volts (within some attainable measurement range). If the digital value 312-2 from the second ADC stage 302-2 is greater than zero, then the residue—or the voltage overshoot—is still too large.

Thus, if the residue is not equal to zero volts, then at block 1210, the ADC control circuitry 402 changes the current offset voltage adjustment code. In this example, the current offset voltage adjustment code is increased to increase the offset voltage adjustment amount to be applied by the adjustment capacitor 722 of the offset adjuster 406 in the fifth phase Φ5. After the current offset voltage adjustment code is changed at block 1210, the procedure can continue at block 1204.

The next round of multiple iterations of zero-volt input signals (at block 1204) and residue measurements (at block 1206) result in a reduced absolute magnitude of the voltage overshoot. After one or more rounds of changing the offset voltage adjustment code (at block 1210), the analog residue signal 308-1 of the first ADC stage 302-1, as represented by the digital value 312-2 of the second ADC stage 302-2, becomes zero within a given measurement error based on the voltage step sizes of the digital circuitry. At block 1212, the first ADC stage 302-1 can use the current offset voltage adjustment code to establish a calibrated offset voltage amount 726 and thereby provide a calibrated offset voltage adjustment amount 604 for the fifth phase Φ5 of an ADC operation that is performed by the offset adjuster 406. Alternatively, the current offset voltage adjustment code can be considered a first-level offset voltage adjustment code for a first phase of a determination procedure for the calibrated offset voltage adjustment amount. The offset voltage adjustment code can be refined using a second phase, which is described next.

FIG. 12-2 is a flowchart illustrating example calibration processes 1200-2 for a second phase for determining an offset voltage amount 726. The processes 1200-2 include seven (7) blocks 1222-1234. The offset voltage adjustment code that is determined using the first phase with the calibration process 1200-1 provides an offset adjustment amount to render the output residue at zero volts if the input signal is zero volts. The intersection of these two values, however, may not be the middle voltage level. To determine the middle voltage level of the plot, the input signal may be adjusted, such as by a few millivolts (mV), across multiple input signals around zero volts. Obtaining an input signal that can be tailored this finely may be difficult in some circuitries.

To accommodate this situation, the voltage 430 at the node 410 can be adjusted using a capacitive DAC instead of varying the input signal. At block 1222, a calibration controller (e.g., of the ADC control circuitry 402 of FIG. 4) can simulate deviations in the input signal using a capacitive DAC. Further, "existing" circuitry of the ADC stage 302 can be used. For example, the shift capacitors 712 of the voltage shifter 404 can be used to change the initial value of the voltage 430 using the first voltage amount 716-1 or the second voltage amount 716-2, including by using both and one or more switches 714.

At block 1224, the first, under-calibration ADC stage is operated responsive to the simulated deviated input signal. In some cases, the input signal deviation is 1-5 mV, but other values may be used. At block 1226, the residue of the first ADC stage 302-1 is measured based on a digital value 312-2 output by the second ADC stage 302-2. At block 1228, the controller determines if a target quantity of input signal deviations have been measured. Any quantity of input signal deviations may be measured. For example, three values above zero volts and three values below zero volts may be measured. If the target quantity of input signal deviations has not been measured, then at block 1230, the simulated deviation amount of the input signal is changed (e.g., increased or decreased). The acts of blocks 1224 to 1228 can be repeated until the target quantity of data points is obtained.

At block 1232, a midpoint is calculated for the output residue between minimum and maximum measured residue values. At block 1234, the controller adds the calculated residue midpoint to the first-level calibrated offset voltage adjustment amount (from the first phase of FIG. 12-1) to determine an operational calibrated offset voltage amount 726 to be applied to the node 410 after the ramping is terminated. This sum can therefore establish a calibrated offset voltage amount 726 to provide a calibrated offset voltage adjustment amount 604 (of FIG. 6) for the fifth phase Φ5 of an ADC operation that is performed by the offset adjuster 406. A calibration controller (e.g., of the ADC control circuitry 402 of FIG. 4) can also tune a calibrated version of the offset voltage amount based on a digital value produced by the ramp generator to account for mismatch in the elements of the time-to-digital converter. For example, a correction can be applied based on each ADC output code using a lookup table.

Figure 13:
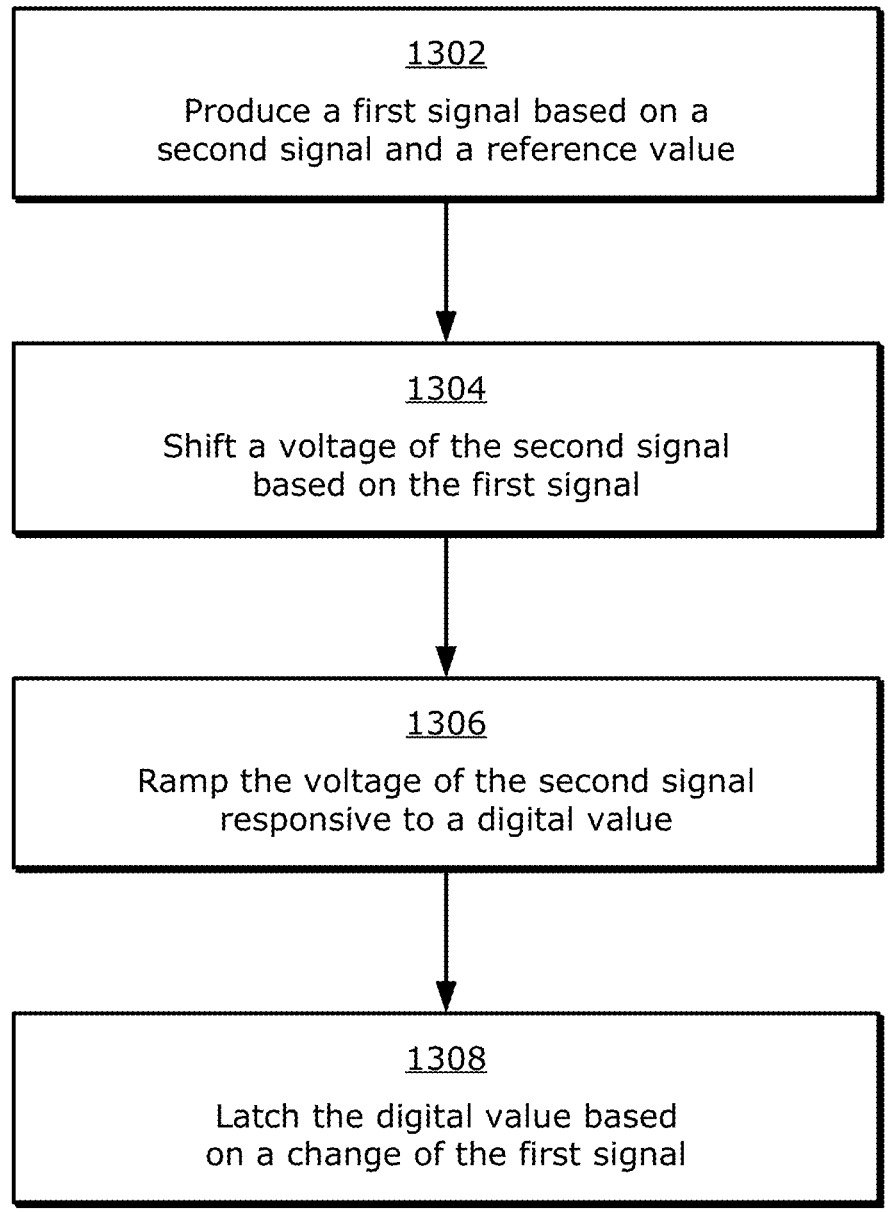
FIG. 13 is a flow diagram illustrating an example process for analog-to-digital conversion.

FIG. 13 is a flow diagram illustrating an example process 1300 for analog-to-digital conversion. The process 1300 is described in the form of a set of blocks 1302-1308 that specify operations that can be performed. However, operations are not necessarily limited to the order shown in FIG.

13 or described herein, for the operations may be implemented in alternative orders or in fully or partially overlapping manners. Also, more, fewer, and/or different operations may be implemented to perform the process 1300 or an alternative process. Operations represented by the illustrated blocks of the process 1300 may be performed by an ADC 130 or a portion thereof.

At block 1302, the ADC is producing a first signal based on a second signal and a reference value. For example, a reference-crossing detector 132 can produce a first signal (e.g., at an output 416) based on a second signal (e.g., that is present at an input 414) and a reference value 428. For instance, the reference-crossing detector 132 may indicate whether a voltage 430 at the input 414 of the reference-crossing detector 132 is greater than or less than the reference value 428 using a detection signal 420. An analog input signal 418 may be sampled using at least one switch 408 of the ADC to obtain the second signal.

In some implementations, the producing of block 1302 can include asynchronously comparing the second signal (e.g., that is present at the input 414 of the reference-crossing detector 132) to the reference value 428, with the reference value 428 corresponding to at least one of a ground voltage or an approximately zero voltage. In such cases, the reference-crossing detector 132 may operate as a zero-crossing detector. The producing of block 1302 may also include providing a voltage value for the first signal (e.g., at the output 416 of the reference-crossing detector 132) based on whether the second signal is less than or greater than the reference value 428.

At block 1304, the ADC is shifting a voltage of the second signal based on the first signal. For example, a voltage shifter 404 can shift a voltage 430 of the second signal at the input 414 based on the first signal at the output 416. In some cases, an amount of the voltage shift 716 may be dependent on a value of the voltage 430 relative to the reference value 428 before the voltage shifter 404 shifts the voltage.

At block 1306, the ADC is ramping the voltage of the second signal responsive to a digital value. For example, a ramp generator 134 can ramp the voltage 430 of the second signal at the input 414 responsive to a digital value 312, which is based at least partially on the first signal from the output 416. To do so, the ramp generator 134 may permit the digital value 312 to increase, and thus the voltage 430 to climb or descend, until the first signal from the output 416 (e.g., a lock digital value signal 420-2) transitions to indicate that the voltage 430 has crossed the reference value 428. The ramp generator 134 can start ramping the voltage 430 responsive to the ramp trigger 426, which may be derived from the sampling signal 422.

At block 1308, the ADC is latching the digital value based on a change of the first signal. For example, the ramp generator 134 can latch the digital value 312 based on a change of the first signal provided by the reference-crossing detector 132 via the output 416. Here, the ramp generator 134 may latch the digital value 312 to prevent changes thereto using multiple latches 704-1 to 704-N responsive to the lock digital value signal 420-2. The latching may include triggering the multiple latches 704-1 to 704-N using the first signal responsive to the second signal crossing the reference value.

In some implementations, the process 1300 can further include adjusting, responsive to the latching, the voltage of the second signal (e.g., that is present at an input 414 of the reference-crossing detector 132) based on an offset voltage amount 726 (or offset voltage level). The process 1300 can additionally include calibrating the offset voltage amount 726 based on an output of an analog-to-digital converter (ADC), such as a "separate" ADC or a succeeding ADC stage 302 of a pipelined analog-to-digital converter (ADC) 130-1.

Figure 14:
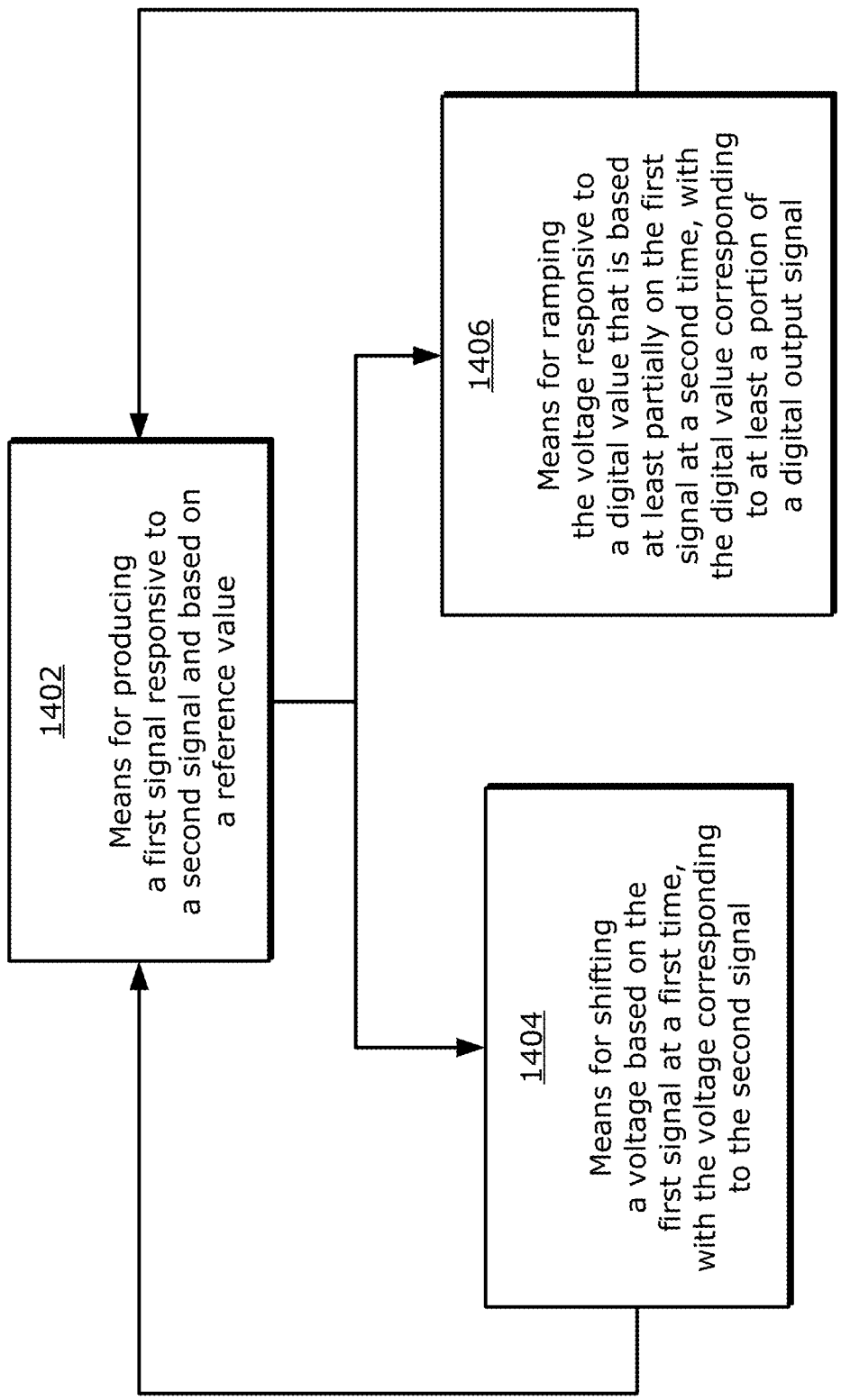
FIG. 14 is a block diagram of an example ADC including at least a reference-crossing detector mechanism, a ramp generator mechanism, and a voltage shifter mechanism.

FIG. 14 is a block diagram 1400 of an example ADC 130 (e.g., of FIGS. 1-3) including at least a reference-crossing detector mechanism, a voltage shifter mechanism, and a ramp generator mechanism. An apparatus can include the ADC 130. The ADC 130 can include at 1402 means for producing a first signal responsive to a second signal and based on a reference value. The ADC 130 can also include at 1404 means for shifting a voltage based on the first signal at a first time, with the voltage corresponding to the second signal. The ADC 130 can further include at 1406 means for ramping the voltage responsive to a digital value that is based at least partially on the first signal at a second time, with the digital value corresponding to at least a portion of a digital output signal. Generally, described actions or method steps and/or described circuitry or mechanisms can realize various means for performing acts and/or providing features. For example, method steps may be embodied in respective means for carrying out the step. Similarly, circuit components may be embodied in respective means for providing the corresponding structure and/or operation.

This section describes some aspects of example implementations and/or example configurations related to the apparatuses and/or processes presented above.

Example aspect 1: An apparatus comprising:
an analog-to-digital converter (ADC) comprising:
a reference-crossing detector comprising an input and an output;
a ramp generator coupled between the output of the reference-crossing detector and the input of the reference-crossing detector; and
a voltage shifter coupled between the output of the reference-crossing detector and the input of the reference-crossing detector.

Example aspect 2: The apparatus of example aspect 1, wherein the voltage shifter comprises:
a capacitor coupled via at least one terminal to the input of the reference-crossing detector.

Example aspect 3: The apparatus of example aspect 2, wherein:
a first terminal of the capacitor is coupled to the input of the reference-crossing detector; and
the voltage shifter comprises at least one switch coupled between:
a second terminal of the capacitor; and
a first voltage rail and a second voltage rail.

Example aspect 4: The apparatus of example aspect 3, wherein the voltage shifter comprises:
logic coupled between the output of the reference-crossing detector and the at least one switch.

Example aspect 5: The apparatus of example aspect 4, wherein the logic comprises:
a flip-flop comprising a data input coupled to the output of the reference-crossing detector.

Example aspect 6: The apparatus of example aspect 4 or 5, wherein the logic is configured to:
control the at least one switch to selectively connect the second terminal of the capacitor to the first voltage rail or the second voltage rail based on a signal received from the output of the reference-crossing detector.

Example aspect 7: The apparatus of example aspect 6, wherein:
the at least one switch comprises a first switch and a second switch; and the capacitor is configured to selectively:
adjust a voltage at the input of the reference-crossing detector by a first voltage amount responsive to the first switch connecting the capacitor to the first voltage rail; or
adjust the voltage at the input of the reference-crossing detector by a second voltage amount responsive to the second switch connecting the capacitor to the second voltage rail.

Example aspect 8: The apparatus of any one of example aspects 3 or 4-7, wherein:
the at least one switch comprises multiple switches;
the capacitor comprises a differential array of capacitors, the differential array of capacitors comprising a first set of capacitors and a second set of capacitors;
the first voltage rail comprises a plus voltage rail;
the second voltage rail comprises a minus voltage rail;
each respective capacitor of the first set of capacitors comprises a first terminal coupled to a plus input of the reference-crossing detector and a second terminal selectively coupled to the plus voltage rail or the minus voltage rail via a respective first plus switch or a first minus switch of the multiple switches; and
each respective capacitor of the second set of capacitors comprises a first terminal coupled to a minus input of the reference-crossing detector and a second terminal selectively coupled to the plus voltage rail or the minus voltage rail via a respective second plus switch or a second minus switch of the multiple switches.

Example aspect 9: The apparatus of any one of the preceding example aspects, wherein the voltage shifter is configured to:
adjust a voltage at the input of the reference-crossing detector based on a signal produced at the output of the reference-crossing detector.

Example aspect 10: The apparatus of example aspect 9, wherein the voltage shifter is configured to:
adjust the voltage at the input of the reference-crossing detector based on a voltage level of a sampled signal that is coupled to the input of the reference-crossing detector.

Example aspect 11: The apparatus of example aspect 10, wherein the voltage shifter is configured to:
selectively adjust the voltage at the input of the reference-crossing detector by:
a first voltage amount responsive to the voltage level of the sampled signal being above a reference voltage level; or
a second voltage amount responsive to the voltage level of the sampled signal being below a reference voltage level, the first voltage amount being different from the second voltage amount.

Example aspect 12: The apparatus of any one of the preceding example aspects, wherein the reference-crossing detector is configured to:
change a signal at the output of the reference-crossing detector based on a signal at the input of the reference-crossing detector and a reference voltage level.

Example aspect 13: The apparatus of example aspect 12, wherein:
the reference-crossing detector comprises a zero-crossing detector; and
the zero-crossing detector is configured to change a voltage at the output of the zero-crossing detector based on a voltage at the input of the zero-crossing detector and at least one of a ground voltage or an approximately zero voltage.

Example aspect 14: The apparatus of any one of the preceding example aspects, wherein the ramp generator comprises:
a capacitor coupled via at least one terminal to the input of the reference-crossing detector; and
a time-to-digital converter coupled between the output of the reference-crossing detector and the capacitor.

Example aspect 15: The apparatus of example aspect 14, wherein the capacitor comprises:
an array of capacitors, the array of capacitors comprising multiple capacitors with each capacitor of the multiple capacitors coupled via at least one terminal to the input of the reference-crossing detector.

Example aspect 16: The apparatus of example aspect 15, wherein:
the time-to-digital converter comprises multiple buffers coupled together in series; and
respective buffers of the multiple buffers are coupled to respective capacitors of the multiple capacitors.

Example aspect 17: The apparatus of example aspect 16, wherein the time-to-digital converter comprises:
multiple latches, respective latches of the multiple latches coupled between the respective buffers of the multiple buffers and the respective capacitors of the multiple capacitors.

Example aspect 18: The apparatus of example aspect 17, wherein the respective latches of the multiple latches are configured to:
latch respective values from the respective buffers of the multiple buffers responsive to a signal received from the output of the reference-crossing detector.

Example aspect 19: The apparatus of example aspect 16 or 17, wherein the ramp generator comprises:
multiple switches, respective switches of the multiple switches coupled between the respective buffers of the multiple buffers and the respective capacitors of the multiple capacitors.

Example aspect 20: The apparatus of example aspect 19, wherein:
respective outputs of the respective buffers of the multiple buffers are configured to control respective states of the respective switches of the multiple switches.

Example aspect 21: The apparatus of example aspect 20, wherein the time-to-digital converter is configured to:
encode a digital value representative of at least a portion of a digital output signal of the analog-to-digital converter in the respective states of the respective switches of the multiple switches.

Example aspect 22: The apparatus of any one of the preceding example aspects, wherein the analog-to-digital converter comprises:
an offset adjuster coupled between the output of the reference-crossing detector and the input of the reference-crossing detector.

Example aspect 23: The apparatus of example aspect 22, wherein the offset adjuster comprises:
a capacitor coupled via at least one terminal to the input of the reference-crossing detector.

Example aspect 24: The apparatus of example aspect 23, wherein:
a first terminal of the capacitor is coupled to the input of the reference-crossing detector; and
the offset adjuster comprises at least one switch coupled between:
a second terminal of the capacitor; and
a voltage rail.

Example aspect 25: The apparatus of example aspect 24, wherein:

the offset adjuster comprises logic coupled between the output of the reference-crossing detector and the at least one switch; and the logic is configured to control at least one state of the at least one switch based on a signal received from the output of the reference-crossing detector.

Example aspect 26: The apparatus of example aspect 25, wherein:

the at least one switch comprises a first switch coupled between the second terminal of the capacitor and the voltage rail;

the at least one switch comprises a second switch coupled between the second terminal of the capacitor and a node configured to be held to a direct current (DC) voltage;

the logic is configured to use the second switch to disconnect the second terminal of the capacitor from the node and use the first switch to connect the second terminal of the capacitor to the voltage rail responsive to a change in the signal received from the output of the reference-crossing detector; and the capacitor is configured to reduce an absolute value of a voltage at the input of the reference-crossing detector responsive to the at least one switch connecting the second terminal of the capacitor to the voltage rail.

Example aspect 27: The apparatus of example aspect 24 or 25, wherein the analog-to-digital converter is configured to:

hold the voltage rail to an offset voltage amount.

Example aspect 28: The apparatus of example aspect 27, wherein the analog-to-digital converter is configured to:

calibrate the offset voltage amount based on an output of a succeeding analog-to-digital conversion stage of a pipelined analog-to-digital converter.

Example aspect 29: The apparatus of example aspect 28, wherein the analog-to-digital converter is configured to:

tune a calibrated version of the offset voltage amount based on a digital value produced by the ramp generator.

Example aspect 30: The apparatus of any one of the preceding example aspects, further comprising:

a pipelined analog-to-digital converter comprising:

multiple analog-to-digital conversion stages; and at least one amplifier coupled to and interlaced between two or more of the multiple analog-to-digital conversion stages, wherein an analog-to-digital conversion stage of the multiple analog-to-digital conversion stages comprises the analog-to-digital converter.

Example aspect 31: The apparatus of example aspect 30, wherein the pipelined analog-to-digital converter is configured to:

use the input of the reference-crossing detector to provide an input for the analog-to-digital conversion stage at a first time; and use the input of the reference-crossing detector to provide an output for the analog-to-digital conversion stage at a second time.

Example aspect 32: The apparatus of any one of the preceding example aspects, further comprising:

a wireless interface device, wherein the wireless interface device comprises the analog-to-digital converter.

Example aspect 33: The apparatus of example aspect 32, further comprising:

a display screen; and at least one processor operatively coupled to the display screen and at least a portion of the wireless interface device, the at least one processor configured to present one or more graphical images on the display screen based on one or more wireless signals received using the analog-to-digital converter of the wireless interface device.

Example aspect 34: The apparatus of any one of the preceding example aspects, wherein the analog-to-digital converter comprises an asynchronous digital ramp analog-to-digital converter.

Example aspect 35: The apparatus of any one of the preceding example aspects, wherein:

the referencing-crossing detector is configured to produce a detection signal at the output based on an analog voltage present at the input;

the voltage shifter is configured to shift the analog voltage based on a value of the detection signal at a first time to produce a shifted voltage at the output of the referencing-crossing detector; and the ramp generator is configured to ramp the shifted voltage to generate a ramped voltage at the output of the referencing-crossing detector and produce a digital value responsive to another value of the detection signal at a second time.

Example aspect 36: The apparatus of example aspect 35, further comprising:

an offset adjuster coupled between the output of the reference-crossing detector and the input of the reference-crossing detector, wherein:

the offset adjuster is configured to adjust the ramped voltage to produce an adjusted voltage at the output of the referencing-crossing detector responsive to the other value of the detection signal at the second time; and the analog-to-digital converter is configured to provide the adjusted voltage as an analog residue signal for a succeeding analog-to-digital conversion stage.

Example aspect 37: An apparatus for analog-to-digital conversion, the apparatus comprising:

means for producing a first signal responsive to a second signal and based on a reference value;

means for shifting a voltage based on the first signal at a first time, the voltage corresponding to the second signal; and means for ramping the voltage responsive to a digital value that is based at least partially on the first signal at a second time, the digital value corresponding to at least a portion of a digital output signal.

Example aspect 38: The apparatus of example aspect 37, wherein the means for ramping comprises:

capacitive means for converting the digital value to an analog version of the voltage.

Example aspect 39: The apparatus of example aspect 37 or 38, wherein the means for shifting comprises:

means for adjusting the voltage by an amount that depends, at least partly, on the first signal at the first time.

Example aspect 40: The apparatus of any one of example aspects 37-39, further comprising:

means for offsetting the voltage based on the first signal at a third time.

Example aspect 41: The apparatus of example aspect 40, wherein the means for offsetting comprises:

means for adjusting the voltage responsive to the third time, with the third time depending, at least partly, on a change of the first signal after voltage ramping has started.

Example aspect 42: The apparatus of example aspect 40 or 41, further comprising:

means for calibrating a voltage amount by which the means for offsetting adjusts the voltage at the third time.

Example aspect 43: A method for analog-to-digital conversion, the method comprising:

producing a first signal based on a second signal and a reference value;

shifting a voltage of the second signal based on the first signal;

ramping the voltage of the second signal responsive to a digital value; and latching the digital value based on a change of the first signal.

Example aspect 44: The method of example aspect 43, further comprising:

responsive to the latching, adjusting the voltage of the second signal based on an offset voltage amount.

Example aspect 45: The method of example aspect 44, further comprising:

calibrating the offset voltage amount based on an output of an analog-to-digital converter (ADC).

Example aspect 46: The method of any one of example aspects 43-45, wherein the producing comprises:

asynchronously comparing the second signal to the reference value, the reference value corresponding to at least one of a ground voltage or an approximately zero voltage; and providing a voltage value for the first signal based on whether the second signal is less than or greater than the reference value.

Example aspect 47: The method of any one of example aspects 43-46, wherein the shifting comprises selectively:

adjusting the voltage of the second signal by a first amount responsive to the second signal being greater than the reference value; or adjusting the voltage of the second signal by a second amount responsive to the second signal being less than the reference value.

Example aspect 48: The method of any one of example aspects 43-47, wherein the ramping comprises:

changing respective states of respective switches of multiple switches coupled to respective capacitors of multiple capacitors; and adjusting the voltage of the second signal using the multiple capacitors based on the changing of the respective states of the respective switches.

Example aspect 49: The method of any one of example aspects 43-48, further comprising:

sampling an analog input signal to obtain the second signal, wherein the ramping comprises:

propagating a signal through multiple buffers responsive to the sampling; and coupling respective outputs of respective buffers of the multiple buffers to respective latches of multiple latches.

Example aspect 50: The method of example aspect 49, wherein the latching comprises:

triggering the multiple latches using the first signal responsive to the second signal crossing the reference value.

Example aspect 51: An apparatus comprising:

a pipelined analog-to-digital converter comprising:

multiple analog-to-digital conversion stages, at least one analog-to-digital conversion stage of the multiple analog-to-digital conversion stages comprising:

a reference-crossing detector comprising an input and an output;

a ramp generator coupled to the output of the reference-crossing detector, the ramp generator comprising:

multiple buffers coupled together in series; and multiple capacitors coupled between the multiple buffers and the input of the reference-crossing detector; and at least one capacitor coupled between the output of the reference-crossing detector and the input of the reference-crossing detector; and at least one amplifier coupled between two or more analog-to-digital conversion stages of the multiple analog-to-digital conversion stages.

Example aspect 52: The apparatus of example aspect 51, wherein:

the at least one capacitor is configured to adjust a voltage corresponding to the input of the reference-crossing detector based on a signal provided at the output of the reference-crossing detector.

Example aspect 53: The apparatus of example aspect 52, wherein the at least one analog-to-digital conversion stage of the multiple analog-to-digital conversion stages comprises:

logic coupled between the output of the reference-crossing detector and the at least one capacitor, the logic configured to cause the at least one capacitor to adjust the voltage corresponding to the input of the reference-crossing detector at a time that is responsive to a change of the signal received from the output of the reference-crossing detector.

Example aspect 54: The apparatus of example aspect 53, wherein:

the at least one capacitor and the logic jointly comprise an offset adjuster configured to adjust the voltage corresponding to the input of the reference-crossing detector responsive to termination of a ramping of the voltage by the ramp generator.

Example aspect 55: The apparatus of any one of example aspects 52-54, wherein:

the at least one capacitor is configured to adjust the voltage corresponding to the input of the reference-crossing detector to move the voltage closer to at least one of a ground voltage or an approximately zero voltage.

Example aspect 56: The apparatus of example aspect 55, wherein:

the at least one amplifier comprises at least one residue amplifier configured to amplify the voltage after the at least one capacitor moves the voltage closer to at least one of the ground voltage or the approximately zero voltage.

Example aspect 57: The apparatus of any one of example aspects 52-56, wherein the at least one analog-to-digital conversion stage of the multiple analog-to-digital conversion stages comprises:

logic coupled between the output of the reference-crossing detector and the at least one capacitor, the logic configured to cause the at least one capacitor to selectively shift the voltage corresponding to the input of the reference-crossing detector by one of at least two amounts based on a voltage value of the signal received from the output of the reference-crossing detector.

Example aspect 58: The apparatus of example aspect 57, wherein:

the at least one capacitor and the logic jointly comprise a voltage shifter configured to selectively adjust the voltage corresponding to the input of the reference-crossing detector prior to a ramping of the voltage by the ramp generator.

Example aspect 59: The apparatus of any one of example aspects 51-58, wherein the pipelined analog-to-digital converter comprises:

at least one register coupled to the ramp generator of the at least one analog-to-digital conversion stage of the multiple analog-to-digital conversion stages, the at least one register configured to:

receive multiple digital values, each respective digital value of the multiple digital values received from a respective analog-to-digital conversion stage of the multiple analog-to-digital conversion stages; and combine the multiple digital values into a digital output signal for the pipelined analog-to-digital converter.

Example aspect 60: An apparatus comprising:
an analog-to-digital converter (ADC) comprising:
a reference-crossing detector comprising an input and an output;
a ramp generator coupled between the output of the reference-crossing detector and the input of the reference-crossing detector; and
an offset adjuster coupled between the output of the reference-crossing detector and the input of the reference-crossing detector.

Example aspect 61: The apparatus of example aspect 60, wherein the offset adjuster comprises:
a capacitor coupled via at least one terminal to the input of the reference-crossing detector.

Example aspect 62: The apparatus of example aspect 61, wherein:
a first terminal of the capacitor is coupled to the input of the reference-crossing detector; and
the offset adjuster comprises at least one switch coupled between:
a second terminal of the capacitor; and
a voltage rail.

Example aspect 63: The apparatus of example aspect 62, wherein:
the offset adjuster comprises logic coupled between the output of the reference-crossing detector and the at least one switch; and
the logic is configured to control at least one state of the at least one switch based on a signal received from the output of the reference-crossing detector.

Example aspect 64: The apparatus of example aspect 63, wherein:
the at least one switch comprises a first switch coupled between the second terminal of the capacitor and the voltage rail;
the at least one switch comprises a second switch coupled between the second terminal of the capacitor and a node configured to be held to a direct current (DC) voltage;
the logic is configured to use the second switch to disconnect the second terminal of the capacitor from the node and use the first switch to connect the second terminal of the capacitor to the voltage rail responsive to a change in the signal received from the output of the reference-crossing detector; and
the capacitor is configured to reduce an absolute value of a voltage at the input of the reference-crossing detector responsive to the at least one switch connecting the second terminal of the capacitor to the voltage rail.

Example aspect 65: The apparatus of any one of example aspects 62-64, wherein the analog-to-digital converter is configured to:
hold the voltage rail to an offset voltage amount.

Example aspect 66: The apparatus of example aspect 65, wherein the analog-to-digital converter is configured to:

calibrate the offset voltage amount based on an output of a succeeding analog-to-digital conversion stage of a pipelined analog-to-digital converter.

Example aspect 67: The apparatus of example aspect 66, wherein the analog-to-digital converter is configured to:
tune a calibrated version of the offset voltage amount based on a digital value produced by the ramp generator.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first switch" in one context may be identified as a "second switch" in another context. Similarly, a "first capacitor array" in one claim may be recited as a "second capacitor array" in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:
1. An apparatus comprising:
an analog-to-digital converter (ADC) comprising:
a reference-crossing detector comprising an input and an output;
a ramp generator coupled between the output of the reference-crossing detector and the input of the reference-crossing detector; and
a voltage shifter coupled between the output of the reference-crossing detector and the input of the reference-crossing detector.

2. The apparatus of claim 1, wherein the voltage shifter comprises:
a capacitor coupled via at least one terminal to the input of the reference-crossing detector.

3. The apparatus of claim 2, wherein:
a first terminal of the capacitor is coupled to the input of the reference-crossing detector; and
the voltage shifter comprises at least one switch coupled between:
a second terminal of the capacitor; and
a first voltage rail and a second voltage rail.

4. The apparatus of claim 3, wherein the voltage shifter comprises:
logic coupled between the output of the reference-crossing detector and the at least one switch.

5. The apparatus of claim 4, wherein the logic comprises:
a flip-flop comprising a data input coupled to the output of the reference-crossing detector.

6. The apparatus of claim 4, wherein the logic is configured to:
control the at least one switch to selectively connect the second terminal of the capacitor to the first voltage rail or the second voltage rail based on a signal received from the output of the reference-crossing detector.

7. The apparatus of claim 6, wherein:
the at least one switch comprises a first switch and a second switch; and
the capacitor is configured to selectively:
adjust a voltage at the input of the reference-crossing detector by a first voltage amount responsive to the first switch connecting the capacitor to the first voltage rail; or
adjust the voltage at the input of the reference-crossing detector by a second voltage amount responsive to the second switch connecting the capacitor to the second voltage rail.

8. The apparatus of claim 3, wherein:
the at least one switch comprises multiple switches;
the capacitor comprises a differential array of capacitors, the differential array of capacitors comprising a first set of capacitors and a second set of capacitors;
the first voltage rail comprises a plus voltage rail;
the second voltage rail comprises a minus voltage rail;
each respective capacitor of the first set of capacitors comprises a first terminal coupled to a plus input of the reference-crossing detector and a second terminal selectively coupled to the plus voltage rail or the minus voltage rail via a respective first plus switch or a first minus switch of the multiple switches; and
each respective capacitor of the second set of capacitors comprises a first terminal coupled to a minus input of the reference-crossing detector and a second terminal selectively coupled to the plus voltage rail or the minus voltage rail via a respective second plus switch or a second minus switch of the multiple switches.

9. The apparatus of claim 1, wherein the voltage shifter is configured to:
adjust a voltage at the input of the reference-crossing detector based on a signal produced at the output of the reference-crossing detector.

10. The apparatus of claim 9, wherein the voltage shifter is configured to:
adjust the voltage at the input of the reference-crossing detector based on a voltage level of a sampled signal that is coupled to the input of the reference-crossing detector.

11. The apparatus of claim 10, wherein the voltage shifter is configured to:
selectively adjust the voltage at the input of the reference-crossing detector by:
a first voltage amount responsive to the voltage level of the sampled signal being above a reference voltage level; or
a second voltage amount responsive to the voltage level of the sampled signal being below a reference voltage level, the first voltage amount being different from the second voltage amount.

12. The apparatus of claim 1, wherein the reference-crossing detector is configured to:
change a signal at the output of the reference-crossing detector based on a signal at the input of the reference-crossing detector and a reference voltage level.

13. The apparatus of claim 12, wherein:
the reference-crossing detector comprises a zero-crossing detector; and
the zero-crossing detector is configured to change a voltage at the output of the zero-crossing detector based on a voltage at the input of the zero-crossing detector and at least one of a ground voltage or an approximately zero voltage.

14. The apparatus of claim 1, wherein the ramp generator comprises:
a capacitor coupled via at least one terminal to the input of the reference-crossing detector; and
a time-to-digital converter coupled between the output of the reference-crossing detector and the capacitor.

15. The apparatus of claim 14, wherein the capacitor comprises:
an array of capacitors, the array of capacitors comprising multiple capacitors with each capacitor of the multiple capacitors coupled via at least one terminal to the input of the reference-crossing detector.

16. The apparatus of claim 15, wherein:
the time-to-digital converter comprises multiple buffers coupled together in series; and
respective buffers of the multiple buffers are coupled to respective capacitors of the multiple capacitors.

17. The apparatus of claim 16, wherein the time-to-digital converter comprises:
multiple latches, respective latches of the multiple latches coupled between the respective buffers of the multiple buffers and the respective capacitors of the multiple capacitors.

18. The apparatus of claim 17, wherein the respective latches of the multiple latches are configured to:
latch respective values from the respective buffers of the multiple buffers responsive to a signal received from the output of the reference-crossing detector.

19. The apparatus of claim 16, wherein the ramp generator comprises:
multiple switches, respective switches of the multiple switches coupled between the respective buffers of the multiple buffers and the respective capacitors of the multiple capacitors.

20. The apparatus of claim 19, wherein:
respective outputs of the respective buffers of the multiple buffers are configured to control respective states of the respective switches of the multiple switches.

21. The apparatus of claim 20, wherein the time-to-digital converter is configured to:
encode a digital value representative of at least a portion of a digital output signal of the analog-to-digital converter in the respective states of the respective switches of the multiple switches.

22. The apparatus of claim 1, wherein the analog-to-digital converter comprises:
an offset adjuster coupled between the output of the reference-crossing detector and the input of the reference-crossing detector.

23. The apparatus of claim 22, wherein the offset adjuster comprises:
a capacitor coupled via at least one terminal to the input of the reference-crossing detector.

24. The apparatus of claim 23, wherein:
a first terminal of the capacitor is coupled to the input of the reference-crossing detector; and
the offset adjuster comprises at least one switch coupled between:
a second terminal of the capacitor; and
a voltage rail.

25. The apparatus of claim 24, wherein:
the offset adjuster comprises logic coupled between the output of the reference-crossing detector and the at least one switch; and
the logic is configured to control at least one state of the at least one switch based on a signal received from the output of the reference-crossing detector.

26. The apparatus of claim 25, wherein:
the at least one switch comprises a first switch coupled between the second terminal of the capacitor and the voltage rail;
the at least one switch comprises a second switch coupled between the second terminal of the capacitor and a node configured to be held to a direct current (DC) voltage;
the logic is configured to use the second switch to disconnect the second terminal of the capacitor from the node and use the first switch to connect the second terminal of the capacitor to the voltage rail responsive to a change in the signal received from the output of the reference-crossing detector; and
the capacitor is configured to reduce an absolute value of a voltage at the input of the reference-crossing detector responsive to the at least one switch connecting the second terminal of the capacitor to the voltage rail.

27. The apparatus of claim 24, wherein the analog-to-digital converter is configured to:
hold the voltage rail to an offset voltage amount.

28. The apparatus of claim 27, wherein the analog-to-digital converter is configured to:
calibrate the offset voltage amount based on an output of a succeeding analog-to-digital conversion stage of a pipelined analog-to-digital converter.

29. The apparatus of claim 28, wherein the analog-to-digital converter is configured to:
tune a calibrated version of the offset voltage amount based on a digital value produced by the ramp generator.

30. The apparatus of claim 1, further comprising:
a pipelined analog-to-digital converter comprising:
multiple analog-to-digital conversion stages; and
at least one amplifier coupled to and interlaced between two or more of the multiple analog-to-digital conversion stages,
wherein an analog-to-digital conversion stage of the multiple analog-to-digital conversion stages comprises the analog-to-digital converter.

31. The apparatus of claim 30, wherein the pipelined analog-to-digital converter is configured to:
use the input of the reference-crossing detector to provide an input for the analog-to-digital conversion stage at a first time; and
use the input of the reference-crossing detector to provide an output for the analog-to-digital conversion stage at a second time.

32. The apparatus of claim 1, further comprising:
a wireless interface device,
wherein the wireless interface device comprises the analog-to-digital converter.

33. The apparatus of claim 32, further comprising:
a display screen; and
at least one processor operatively coupled to the display screen and at least a portion of the wireless interface device, the at least one processor configured to present one or more graphical images on the display screen based on one or more wireless signals received using the analog-to-digital converter of the wireless interface device.

34. The apparatus of claim 1, wherein the analog-to-digital converter comprises an asynchronous digital ramp analog-to-digital converter.

35. The apparatus of claim 1, wherein:
the referencing-crossing detector is configured to produce a detection signal at the output based on an analog voltage present at the input;
the voltage shifter is configured to shift the analog voltage based on a value of the detection signal at a first time to produce a shifted voltage at the output of the referencing-crossing detector; and
the ramp generator is configured to ramp the shifted voltage to generate a ramped voltage at the output of the referencing-crossing detector and produce a digital value responsive to another value of the detection signal at a second time.

36. The apparatus of claim 35, further comprising:
an offset adjuster coupled between the output of the reference-crossing detector and the input of the reference-crossing detector, wherein:
the offset adjuster is configured to adjust the ramped voltage to produce an adjusted voltage at the output of the referencing-crossing detector responsive to the other value of the detection signal at the second time; and
the analog-to-digital converter is configured to provide the adjusted voltage as an analog residue signal for a succeeding analog-to-digital conversion stage.

37. An apparatus for analog-to-digital conversion, the apparatus comprising:
means for producing a first signal responsive to a second signal and based on a reference value;
means for shifting a voltage based on the first signal at a first time, the voltage corresponding to the second signal; and
means for ramping the voltage responsive to a digital value that is based at least partially on the first signal at a second time, the digital value corresponding to at least a portion of a digital output signal.

38. The apparatus of claim 37, wherein the means for ramping comprises:
capacitive means for converting the digital value to an analog version of the voltage.

39. The apparatus of claim 37, wherein the means for shifting comprises:
    means for adjusting the voltage by an amount that depends, at least partly, on the first signal at the first time.
40. The apparatus of claim 37, further comprising:
    means for offsetting the voltage based on the first signal at a third time.
41. The apparatus of claim 40, wherein the means for offsetting comprises:
    means for adjusting the voltage responsive to the third time, with the third time depending, at least partly, on a change of the first signal after voltage ramping has started.
42. The apparatus of claim 40, further comprising:
    means for calibrating a voltage amount by which the means for offsetting adjusts the voltage at the third time.
43. A method for analog-to-digital conversion, the method comprising:
    producing a first signal based on a second signal and a reference value;
    shifting a voltage of the second signal based on the first signal;
    ramping the voltage of the second signal responsive to a digital value; and
    latching the digital value based on a change of the first signal.
44. The method of claim 43, further comprising:
    responsive to the latching, adjusting the voltage of the second signal based on an offset voltage amount.
45. The method of claim 44, further comprising:
    calibrating the offset voltage amount based on an output of an analog-to-digital converter (ADC).
46. The method of claim 43, wherein the producing comprises:
    asynchronously comparing the second signal to the reference value, the reference value corresponding to at least one of a ground voltage or an approximately zero voltage; and
    providing a voltage value for the first signal based on whether the second signal is less than or greater than the reference value.
47. The method of claim 43, wherein the shifting comprises selectively:
    adjusting the voltage of the second signal by a first amount responsive to the second signal being greater than the reference value; or
    adjusting the voltage of the second signal by a second amount responsive to the second signal being less than the reference value.
48. The method of claim 43, wherein the ramping comprises:
    changing respective states of respective switches of multiple switches coupled to respective capacitors of multiple capacitors; and
    adjusting the voltage of the second signal using the multiple capacitors based on the changing of the respective states of the respective switches.
49. The method of claim 43, further comprising:
    sampling an analog input signal to obtain the second signal, wherein the ramping comprises:
        propagating a signal through multiple buffers responsive to the sampling; and
        coupling respective outputs of respective buffers of the multiple buffers to respective latches of multiple latches.
50. The method of claim 49, wherein the latching comprises:
    triggering the multiple latches using the first signal responsive to the second signal crossing the reference value.
51. An apparatus comprising:
    a pipelined analog-to-digital converter comprising:
        multiple analog-to-digital conversion stages, at least one analog-to-digital conversion stage of the multiple analog-to-digital conversion stages comprising:
            a reference-crossing detector comprising an input and an output;
            a ramp generator coupled to the output of the reference-crossing detector, the ramp generator comprising:
                multiple buffers coupled together in series; and
                multiple capacitors coupled between the multiple buffers and the input of the reference-crossing detector; and
            at least one capacitor coupled between the output of the reference-crossing detector and the input of the reference-crossing detector; and
        at least one amplifier coupled between two or more analog-to-digital conversion stages of the multiple analog-to-digital conversion stages.
52. The apparatus of claim 51, wherein:
    the at least one capacitor is configured to adjust a voltage corresponding to the input of the reference-crossing detector based on a signal provided at the output of the reference-crossing detector.
53. The apparatus of claim 52, wherein the at least one analog-to-digital conversion stage of the multiple analog-to-digital conversion stages comprises:
    logic coupled between the output of the reference-crossing detector and the at least one capacitor, the logic configured to cause the at least one capacitor to adjust the voltage corresponding to the input of the reference-crossing detector at a time that is responsive to a change of the signal received from the output of the reference-crossing detector.
54. The apparatus of claim 53, wherein:
    the at least one capacitor and the logic jointly comprise an offset adjuster configured to adjust the voltage corresponding to the input of the reference-crossing detector responsive to termination of a ramping of the voltage by the ramp generator.
55. The apparatus of claim 52, wherein:
    the at least one capacitor is configured to adjust the voltage corresponding to the input of the reference-crossing detector to move the voltage closer to at least one of a ground voltage or an approximately zero voltage.
56. The apparatus of claim 55, wherein:
    the at least one amplifier comprises at least one residue amplifier configured to amplify the voltage after the at least one capacitor moves the voltage closer to at least one of the ground voltage or the approximately zero voltage.
57. The apparatus of claim 52, wherein the at least one analog-to-digital conversion stage of the multiple analog-to-digital conversion stages comprises:
    logic coupled between the output of the reference-crossing detector and the at least one capacitor, the logic configured to cause the at least one capacitor to selectively shift the voltage corresponding to the input of the reference-crossing detector by one of at least two amounts based on a voltage value of the signal received from the output of the reference-crossing detector.

58. The apparatus of claim 57, wherein:
the at least one capacitor and the logic jointly comprise a voltage shifter configured to selectively adjust the voltage corresponding to the input of the reference-crossing detector prior to a ramping of the voltage by the ramp generator.

59. The apparatus of claim 51, wherein the pipelined analog-to-digital converter comprises:
at least one register coupled to the ramp generator of the at least one analog-to-digital conversion stage of the multiple analog-to-digital conversion stages, the at least one register configured to:
receive multiple digital values, each respective digital value of the multiple digital values received from a respective analog-to-digital conversion stage of the multiple analog-to-digital conversion stages; and
combine the multiple digital values into a digital output signal for the pipelined analog-to-digital converter.

60. An apparatus comprising:
an analog-to-digital converter (ADC) comprising:
a reference-crossing detector comprising an input and an output;
a ramp generator coupled between the output of the reference-crossing detector and the input of the reference-crossing detector; and
an offset adjuster coupled between the output of the reference-crossing detector and the input of the reference-crossing detector.

61. The apparatus of claim 60, wherein the offset adjuster comprises:
a capacitor coupled via at least one terminal to the input of the reference-crossing detector.

62. The apparatus of claim 61, wherein:
a first terminal of the capacitor is coupled to the input of the reference-crossing detector; and
the offset adjuster comprises at least one switch coupled between:
a second terminal of the capacitor; and
a voltage rail.

63. The apparatus of claim 62, wherein:
the offset adjuster comprises logic coupled between the output of the reference-crossing detector and the at least one switch; and
the logic is configured to control at least one state of the at least one switch based on a signal received from the output of the reference-crossing detector.

64. The apparatus of claim 63, wherein:
the at least one switch comprises a first switch coupled between the second terminal of the capacitor and the voltage rail;
the at least one switch comprises a second switch coupled between the second terminal of the capacitor and a node configured to be held to a direct current (DC) voltage;
the logic is configured to use the second switch to disconnect the second terminal of the capacitor from the node and use the first switch to connect the second terminal of the capacitor to the voltage rail responsive to a change in the signal received from the output of the reference-crossing detector; and
the capacitor is configured to reduce an absolute value of a voltage at the input of the reference-crossing detector responsive to the at least one switch connecting the second terminal of the capacitor to the voltage rail.

65. The apparatus of claim 62, wherein the analog-to-digital converter is configured to:
hold the voltage rail to an offset voltage amount.

66. The apparatus of claim 65, wherein the analog-to-digital converter is configured to:
calibrate the offset voltage amount based on an output of a succeeding analog-to-digital conversion stage of a pipelined analog-to-digital converter.

67. The apparatus of claim 66, wherein the analog-to-digital converter is configured to:
tune a calibrated version of the offset voltage amount based on a digital value produced by the ramp generator.

* * * * *